US008629485B2

(12) United States Patent
Yamamura et al.

(10) Patent No.: US 8,629,485 B2
(45) Date of Patent: *Jan. 14, 2014

(54) SEMICONDUCTOR PHOTODETECTION ELEMENT

(75) Inventors: Kazuhisa Yamamura, Hamamatsu (JP);
Akira Sakamoto, Hamamatsu (JP);
Terumasa Nagano, Hamamatsu (JP);
Yasuhito Miyazaki, Hamamatsu (JP);
Yasuhito Yoneta, Hamamatsu (JP);
Hisanori Suzuki, Hamamatsu (JP);
Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.
This patent is subject to a terminal disclaimer.

(21) Appl. No.: 13/143,765

(22) PCT Filed: Feb. 9, 2010

(86) PCT No.: PCT/JP2010/051870
§ 371 (c)(1),
(2), (4) Date: Jul. 8, 2011

(87) PCT Pub. No.: WO2010/098201
PCT Pub. Date: Sep. 2, 2010

(65) Prior Publication Data
US 2011/0266644 A1 Nov. 3, 2011

(30) Foreign Application Priority Data

Feb. 24, 2009 (JP) .................. 2009-041078
Jun. 5, 2009 (JP) .................. 2009-136408

(51) Int. Cl.
*H01L 31/062* (2012.01)
(52) U.S. Cl.
USPC .................. 257/291; 257/E27.133
(58) Field of Classification Search
USPC ......... 257/227, 232, 233, 246, 291, 294, 448, 257/461, 465, E31.115, E27.133
See application file for complete search history.

(56) References Cited

U.S. PATENT DOCUMENTS 4,072,541 A 2/1978 Meulenberg, Jr. et al.
4,277,793 A 7/1981 Webb
(Continued)

FOREIGN PATENT DOCUMENTS

CN 1227419 9/1999
CN 1826700 8/2006
(Continued)

OTHER PUBLICATIONS

G. E. Miner et al., "High Volume Processing of Point Contact Solar Cells," Photovoltaic Specialists Conference, Las Vegas, Sep. 26-30, 1988; Photovoltaic Specialists Conference, New York, IEEE, US, Sep. 26, 1988, pp. 518-522, XP000166693.

(Continued)

*Primary Examiner* — Brook Kebede
(74) *Attorney, Agent, or Firm* — Drinker Biddle & Reath LLP

(57) ABSTRACT

A semiconductor photodetection element SP has a silicon substrate 21 comprised of a semiconductor of a first conductivity type, having a first principal surface 21a and a second principal surface 21b opposed to each other, and having a semiconductor layer 23 of a second conductivity type formed on the first principal surface 21a side; and charge transfer electrodes 25 provided on the first principal surface 21a and adapted to transfer generated charge. In the silicon substrate 21, an accumulation layer 31 of the first conductivity type having a higher impurity concentration than the silicon substrate 21 is formed on the second principal surface 21b side and an irregular asperity 10 is formed in a region opposed to at least the semiconductor region 23, in the second principal surface 21b. The region where the irregular asperity 10 is formed in the second principal surface 21b of the silicon substrate 21 is optically exposed.

8 Claims, 30 Drawing Sheets

(56) References Cited

U.S. PATENT DOCUMENTS

| | | | |
|---|---|---|---|
| 5,589,704 A | 12/1996 | Levine | |
| 7,057,256 B2 | 6/2006 | Carey, III et al. | |
| 7,084,443 B2 * | 8/2006 | Kitano et al. | 257/291 |
| 7,420,257 B2 | 9/2008 | Shibayama | |
| 8,008,741 B2 | 8/2011 | Yamamura et al. | |
| 2001/0008144 A1 | 7/2001 | Uematsu et al. | |
| 2005/0127401 A1 | 6/2005 | Mazur et al. | |
| 2006/0108617 A1 * | 5/2006 | Kitano et al. | 257/291 |
| 2006/0278898 A1 | 12/2006 | Shibayama | |
| 2007/0152250 A1 | 7/2007 | Kim | |
| 2008/0001243 A1 | 1/2008 | Otake et al. | |
| 2009/0101197 A1 | 4/2009 | Morikawa | |
| 2009/0121306 A1 | 5/2009 | Ishikawa | |
| 2009/0142874 A1 | 6/2009 | Arai | |
| 2011/0291218 A1 | 12/2011 | Yamamura et al. | |
| 2011/0298076 A1 | 12/2011 | Yamamura et al. | |
| 2011/0303999 A1 * | 12/2011 | Sakamoto et al. | 257/432 |
| 2012/0061785 A1 | 3/2012 | Ishikawa et al. | |

FOREIGN PATENT DOCUMENTS

| | | |
|---|---|---|
| EP | 0616373 | 9/1994 |
| EP | 0883189 | 12/1998 |
| EP | 1619722 | 1/2006 |
| EP | 1 648 036 | 4/2006 |
| EP | 1840967 | 10/2007 |
| EP | 1 855 322 | 11/2007 |
| JP | 50-147230 | 11/1975 |
| JP | S59-061973 | 4/1984 |
| JP | S59-117274 | 7/1984 |
| JP | 59-224183 | 12/1984 |
| JP | 62-018075 | 1/1987 |
| JP | S64-011556 | 1/1989 |
| JP | H3-089518 | 4/1991 |
| JP | H4-116870 | 4/1992 |
| JP | H5-243600 | 9/1993 |
| JP | H6-045623 | 2/1994 |
| JP | H06-244444 | 9/1994 |
| JP | 6-350068 | 12/1994 |
| JP | 7-235658 | 9/1995 |
| JP | H7-240534 | 9/1995 |
| JP | H8-111542 | 4/1996 |
| JP | H08-242015 | 9/1996 |
| JP | H10-070298 | 3/1998 |
| JP | 10-173998 | 6/1998 |
| JP | 10-335624 | 12/1998 |
| JP | H11-233519 | 8/1999 |
| JP | 2000-299489 | 10/2000 |
| JP | 2002-231993 | 8/2002 |
| JP | 2003-232679 | 8/2003 |
| JP | 2003-258277 | 9/2003 |
| JP | 2003-258285 | 9/2003 |
| JP | 2005-045073 | 2/2005 |
| JP | 2006-179828 | 7/2006 |
| JP | 2008-515196 | 5/2008 |
| JP | 2008-153311 | 7/2008 |
| WO | WO 98/43304 | 10/1998 |
| WO | 00/62344 | 10/2000 |
| WO | WO 03/096427 | 11/2003 |
| WO | WO 2008-004547 | 1/2008 |
| WO | WO 2008/139644 | 11/2008 |

OTHER PUBLICATIONS

Office Action dated May 6, 2013 that issued in U.S. Appl. No. 13/147,871 including Double Patenting rejections at pp. 2-3.

Huang Zhihoung et al., "Microstructured silicon photodetector," Applied Physics Letters, AIP, American Institute of Physics, Melville, NY, US, vol. 89, No. 3, Jul. 20, 2006, p33506-1-p33506-3, XP012088050.

U.S. Office Action dated Sep. 18, 2013 that issued in U.S. Appl. No. 13/320,912 including Double Patenting Rejections on pp. 3-5.

* cited by examiner

SEMICONDUCTOR PHOTODETECTION ELEMENT

TECHNICAL FIELD

The present invention relates to a semiconductor photodetection element.

BACKGROUND ART

A photodiode using compound semiconductors is known as a photodiode with a high spectral sensitivity characteristic in the near-infrared wavelength band (e.g., cf. Patent Literature 1). The photodiode described in Patent Literature 1 is provided with a first light receiving layer comprised of one of InGaAsN, InGaAsNSb, and InGaAsNP, and a second light receiving layer having an absorption edge at a longer wavelength than that of the first light receiving layer and comprised of a quantum well structure.

CITATION LIST

Patent Literature

Patent Literature 1: Japanese Patent Application Laid-open No. 2008-153311

SUMMARY OF INVENTION

Technical Problem

However, such photodiodes using the compound semiconductors are still expensive and their manufacturing steps are also complicated. For this reason, there are desires for practical application of a silicon photodiode being inexpensive and easy to manufacture and having sufficient spectral sensitivity in the near-infrared wavelength band. The conventional silicon photodiodes generally had the spectral sensitivity characteristic with the limit of about 1100 nm on the long wavelength side, but the spectral sensitivity characteristic in the wavelength band of not less than 1000 nm was not enough.

It is an object of the present invention to provide a semiconductor photodetection element using silicon and having a sufficient spectral sensitivity characteristic in the near-infrared wavelength band.

Solution to Problem

A semiconductor photodetection element according to the present invention is one comprising: a silicon substrate which is comprised of a semiconductor of a first conductivity type, which has a first principal surface and a second principal surface opposed to each other, and which has a semiconductor region of a second conductivity type formed on the first principal surface side; and a transfer electrode part which is provided on the first principal surface of the silicon substrate and which transfers generated charge, wherein in the silicon substrate, an accumulation layer of the first conductivity type having a higher impurity concentration than the silicon substrate is formed on the second principal surface side and an irregular asperity is formed in a region opposed to at least the semiconductor region of the second conductivity type, in the second principal surface, and wherein the region where the irregular asperity is formed in the second principal surface of the silicon substrate is optically exposed.

In the semiconductor photodetection element according to the present invention, the irregular asperity is formed in the region opposed to at least the semiconductor region of the second conductivity type, in the second principal surface and, therefore, light incident into the semiconductor photodetection element is reflected, scattered, or diffused by the region to travel through a long distance in the silicon substrate. This causes the light incident into the semiconductor photodetection element to be mostly absorbed in the silicon substrate, without being transmitted by the semiconductor photodetection element (silicon substrate). In the semiconductor photodetection element, therefore, the travel distance of the light incident into the semiconductor photodetection element becomes long and the distance of absorption of light also becomes long, thereby improving the spectral sensitivity characteristic in the near-infrared wavelength band.

Since the accumulation layer of the first conductivity type having the higher impurity concentration than the silicon substrate is formed on the second principal surface side of the silicon substrate, unwanted carriers generated independent of light on the second principal surface side recombine there, which can reduce dark current. Furthermore, the accumulation layer of the first conductivity type prevents carriers generated by light near the second principal surface of the silicon substrate, from being trapped in the second principal surface. For this reason, the carriers generated by light efficiently migrate to a pn junction part between the second conductivity type semiconductor region and the silicon substrate, which can improve the photodetection sensitivity of the semiconductor photodetection element.

In the semiconductor photodetection element according to the present invention, the irregular asperity may be formed in a partial region of the region opposed to the semiconductor region of the second conductivity type. In this case, the spectral sensitivity characteristic in the near-infrared wavelength band is improved, as described above, in a portion corresponding to the region where the irregular asperity is formed in the semiconductor photodetection element.

In the semiconductor photodetection element according to the present invention, the silicon substrate may be thinned in a portion corresponding to the semiconductor region of the second conductivity type, from the second principal surface side while leaving a peripheral portion around the thinned portion. In this case, the semiconductor photodetection element can be obtained with respective light incident surfaces on the first principal surface and second principal surface sides of the silicon substrate.

In the semiconductor photodetection element according to the present invention, a thickness of the accumulation layer of the first conductivity type is preferably larger than a height difference of the irregular asperity. In this case, as described above, the operational effect by the accumulation layer can be ensured.

In the semiconductor photodetection element according to the present invention, the silicon substrate preferably has a thickness set to not more than a pixel pitch. In this case, it is feasible to suppress occurrence of crosstalk between pixels.

A photodiode according to the present invention is one comprising: a silicon substrate which is comprised of a semiconductor of a first conductivity type, which has a first principal surface and a second principal surface opposed to each other, and which has a semiconductor region of a second conductivity type formed on the first principal surface side, wherein in the silicon substrate, an accumulation layer of the first conductivity type having a higher impurity concentration than the silicon substrate is formed on the second principal surface side and an irregular asperity is formed in a region opposed to at least the semiconductor region of the second conductivity type, in the second principal surface, and wherein the region opposed to the semiconductor region of the second conductivity type, in the second principal surface of the silicon substrate is optically exposed.

In the photodiode according to the present invention, the irregular asperity is formed in the region opposed to at least the semiconductor region of the second conductivity type, in the second principal surface and, therefore, light incident into the photodiode is reflected, scattered, or diffused by the region to travel through a long distance in the silicon substrate. This causes the light incident into the photodiode to be mostly absorbed in the silicon substrate, without being transmitted by the photodiode (silicon substrate). In the photodiode, therefore, the light incident into the photodiode travels through the long travel distance and the distance of absorption of light also becomes long, thereby improving the spectral sensitivity characteristic in the near-infrared wavelength band.

Since the accumulation layer of the first conductivity type having the higher impurity concentration than the silicon substrate is formed on the second principal surface side of the silicon substrate, unwanted carriers generated independent of light on the second principal surface side recombine there, which can reduce dark current. Furthermore, the accumulation layer of the first conductivity type prevents carriers generated by light near the second principal surface of the silicon substrate, from being trapped in the second principal surface. For this reason, the carriers generated by light efficiently migrate to a pn junction part between the second conductivity type semiconductor region and the silicon substrate, which can improve the photodetection sensitivity of the photodiode.

Preferably, the silicon substrate is thinned in a portion corresponding to the semiconductor region of the second conductivity type, from the second principal surface side while leaving a peripheral portion around the thinned portion. In this case, the photodiode can be obtained with respective light incident surfaces on the first principal surface and second principal surface sides of the silicon substrate.

Preferably, a thickness of the accumulation layer of the first conductivity type is larger than a height difference of the irregular asperity. In this case, as described above, the operational effect by the accumulation layer can be ensured.

Advantageous Effects of Invention

The present invention successfully provides the semiconductor photodetection element using silicon and having the sufficient spectral sensitivity characteristic in the near-infrared wavelength band.

DESCRIPTION OF EMBODIMENTS

The preferred embodiments of the present invention will be described below in detail with reference to the accompanying drawings. In the description, the same elements or elements with the same functionality will be denoted by the same reference signs, without redundant description.

First Embodiment

A method for manufacturing a photodiode according to the first embodiment will be described with reference to FIGS. 1 to 10. FIGS. 1 to 10 are drawings for explaining the manufacturing method of the photodiode according to the first embodiment.

Figure 1:
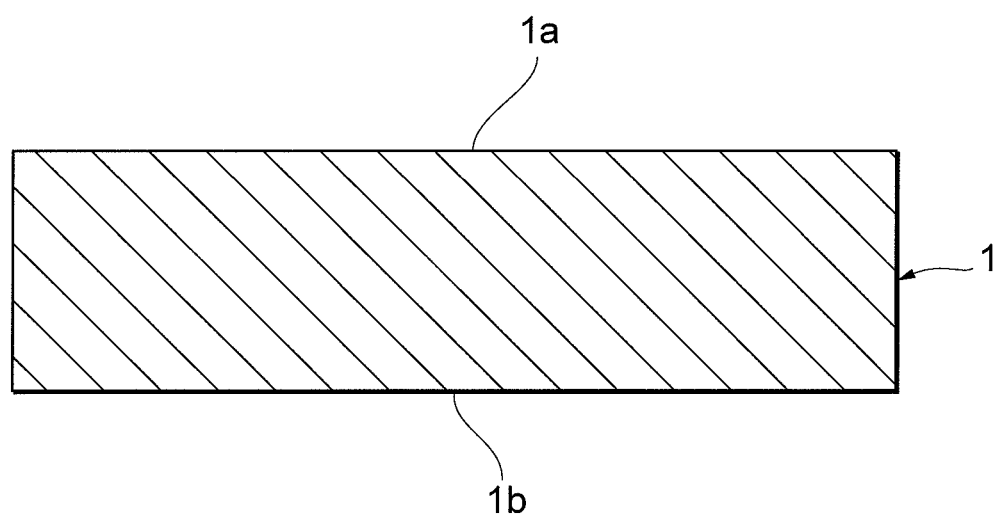
FIG. 1 is a drawing for explaining a manufacturing method of a photodiode according to the first embodiment.

The first step is to prepare an n⁻ type semiconductor substrate 1 comprised of silicon (Si) crystal and having a first principal surface 1a and a second principal surface 1b opposed to each other (cf. FIG. 1). Then n⁻ type semiconductor substrate 1 has the thickness of about 300 μm and the resistivity of about 1 kΩ·cm. In the present embodiment, "high impurity concentration" refers to, for example, an impurity concentration of not less than about $1 \times 10^{17}$ cm⁻³ and is denoted by sign "+" attached to conductivity type; "low impurity concentration" refers to, for example, an impurity concentration of not more than about $1 \times 10^{15}$ cm⁻³ and is denoted by sign "−" attached to conductivity type. Examples of n-type impurities include antimony (Sb), arsenic (As), and so on, and examples of p-type impurities include boron (B) and others.

Figure 2:
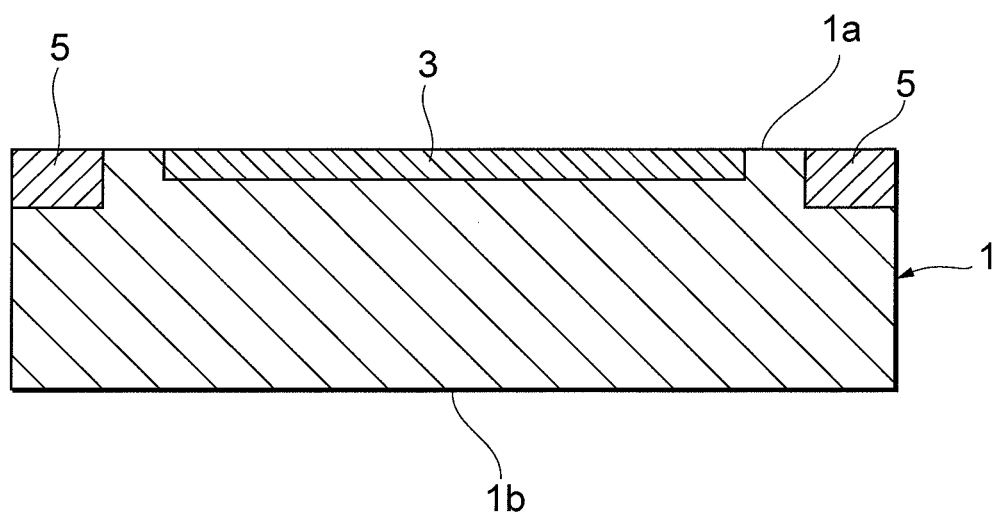
FIG. 2 is a drawing for explaining the manufacturing method of the photodiode according to the first embodiment.

Next, a p⁺ type semiconductor region 3 and an n⁺ type semiconductor region 5 are formed on the first principal surface 1a side of the n⁻ type semiconductor substrate 1 (cf. FIG. 2). The p⁺ type semiconductor region 3 is formed by diffusing a p-type impurity in a high concentration from the first principal surface 1a side in the n⁻ type semiconductor substrate 1, using a mask opening in a central region. The n⁺ type semiconductor region 5 is formed by diffusing an n-type impurity in a higher concentration than in the n⁻ type semiconductor substrate 1, from the first principal surface 1a side in the n⁻ type semiconductor substrate 1 so as to surround the p⁺ type semiconductor region 3, using another mask opening in a peripheral region. The p⁺ type semiconductor region 3 has the thickness of, for example, about 0.55 μm and the sheet resistance of, for example, 44 Ω/sq. The n⁺ type semiconductor region 5 has the thickness of, for example, about 1.5 μm and the sheet resistance of, for example, 12 Ω/sq.

Figure 3:
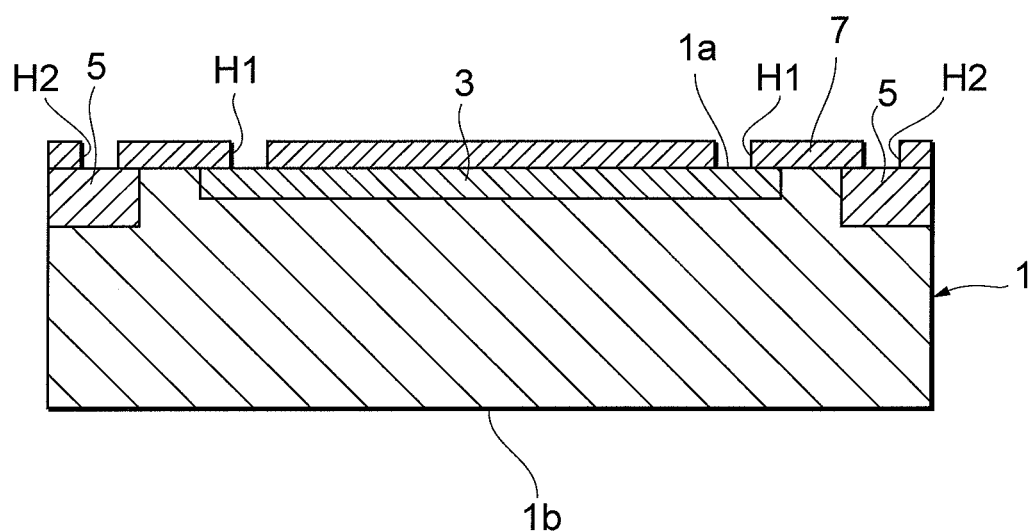
FIG. 3 is a drawing for explaining the manufacturing method of the photodiode according to the first embodiment.

Next, an insulating layer 7 is formed on the first principal surface 1a side of the n⁻ type semiconductor substrate 1 (cf. FIG. 3). The insulating layer 7 is comprised of $SiO_2$ and is formed by thermal oxidation of the n⁻ type semiconductor substrate 1. The insulating layer 7 has the thickness of, for example, about 0.1 μm. Thereafter, contact hole H1 is formed in the insulating layer 7 on the p⁺ type semiconductor region 3 and contact hole H2 is formed in the insulating layer 7 on the n⁺ type semiconductor region 5. An antireflective (AR) layer comprised of SiN may be formed instead of the insulating layer 7.

Figure 4:
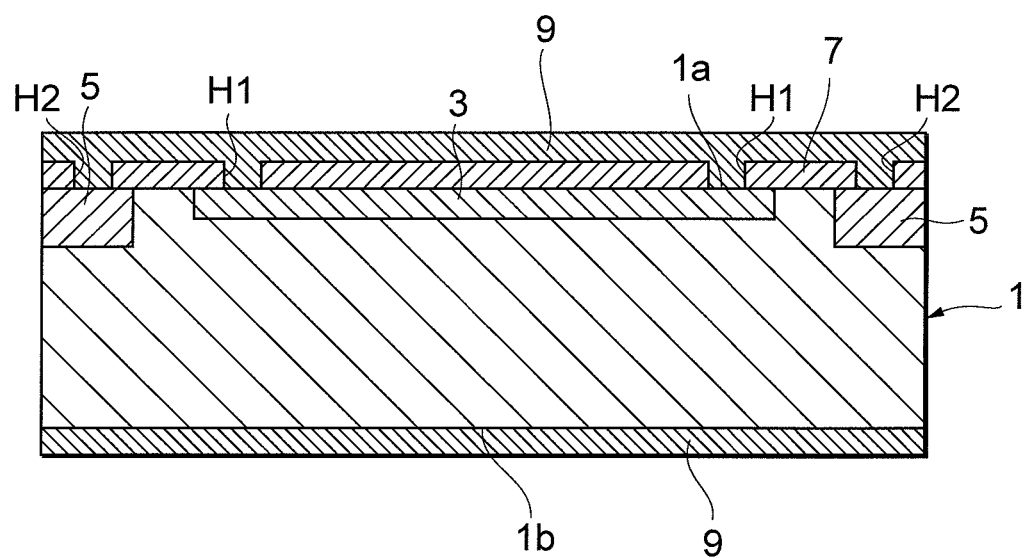
FIG. 4 is a drawing for explaining the manufacturing method of the photodiode according to the first embodiment.
Figure 5:
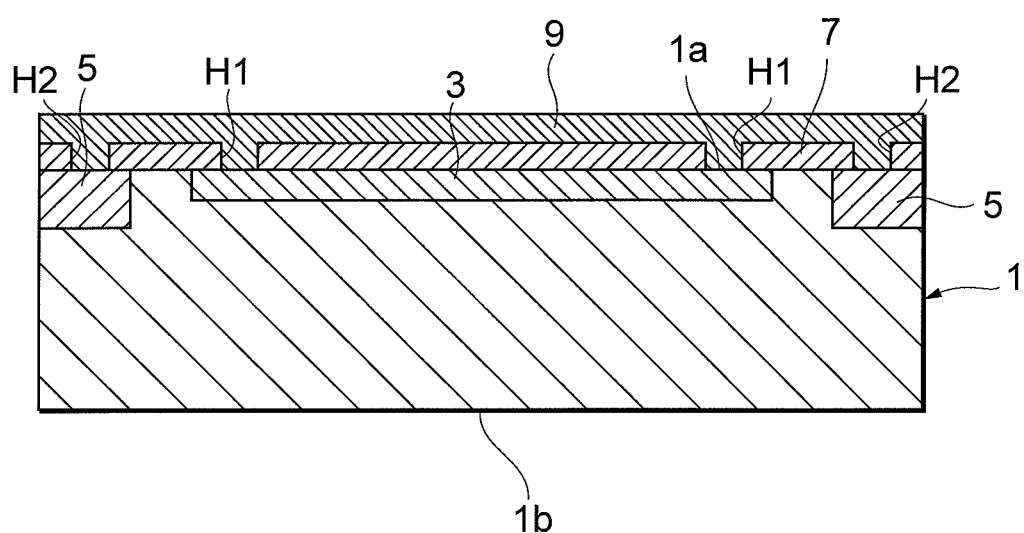
FIG. 5 is a drawing for explaining the manufacturing method of the photodiode according to the first embodiment.

Next, a passivation layer 9 is formed on the second principal surface 1b of the n⁻ type semiconductor substrate 1 and on the insulating layer 7 (cf. FIG. 4). The passivation layer 9 is comprised of SiN and is formed, for example, by the plasma CVD process. The passivation layer 9 has the thickness of, for example, 0.1 μm. Then the n⁻ type semiconductor substrate 1 is polished from the second principal surface 1b side before the thickness of the n⁻ type semiconductor substrate 1 reaches a desired thickness (cf. FIG. 5). This process removes the passivation layer 9 from on the second principal surface 1b of the n⁻ type semiconductor substrate 1, thereby exposing the n⁻ type semiconductor substrate 1. A surface exposed by polishing is also referred to herein as the second principal surface 1b. The desired thickness is, for example, 270 μm.

Figure 6:
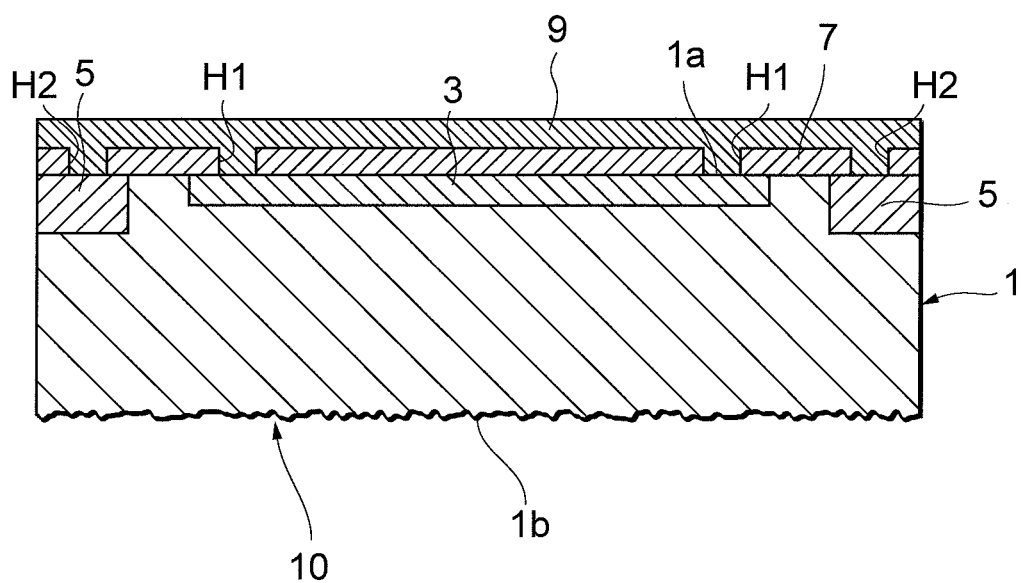
FIG. 6 is a drawing for explaining the manufacturing method of the photodiode according to the first embodiment.
Figure 7:
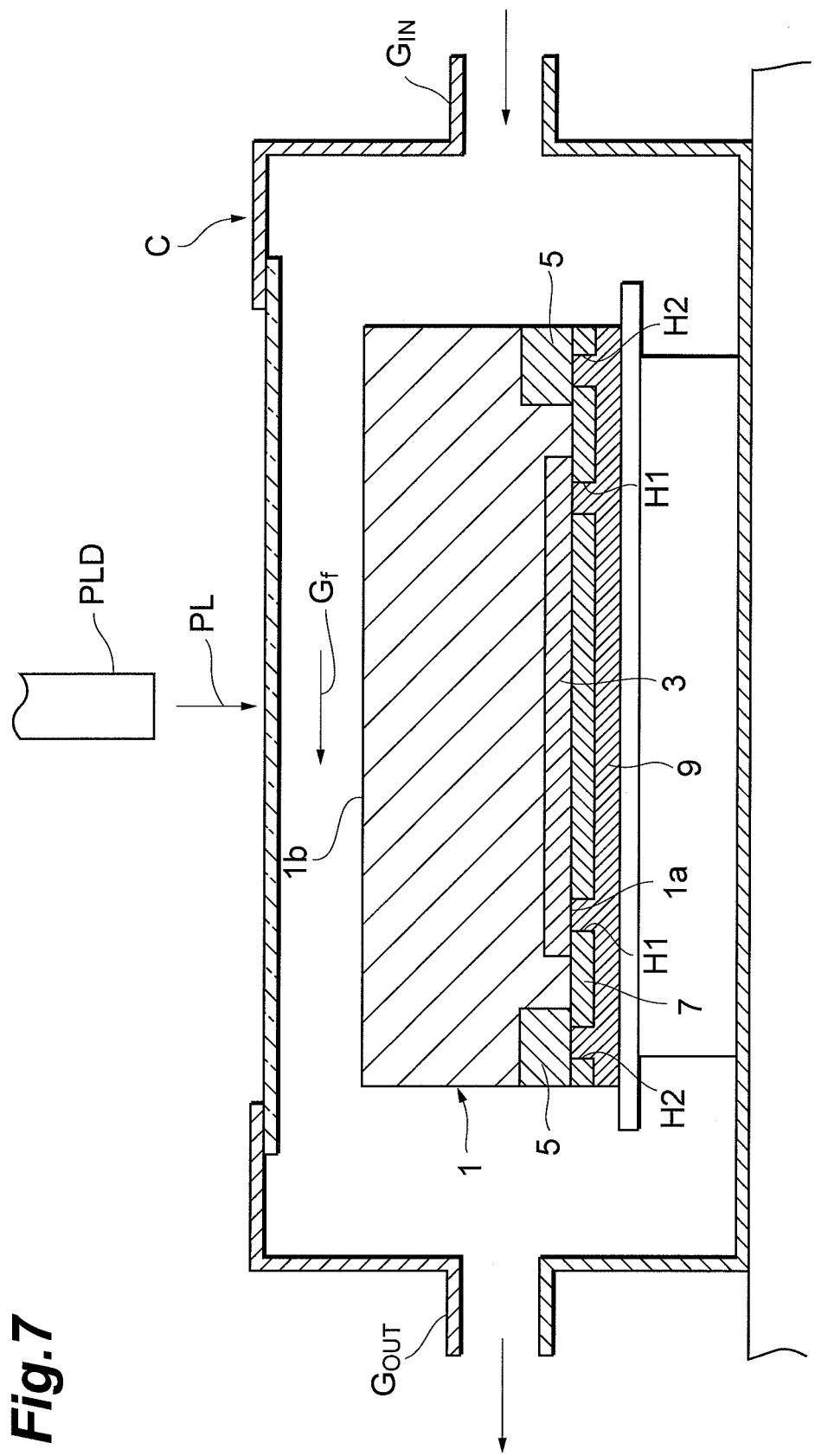
FIG. 7 is a drawing for explaining the manufacturing method of the photodiode according to the first embodiment.

Next, the second principal surface 1b of the n⁻ type semiconductor substrate 1 is subjected to irradiation with a pulsed laser beam PL, thereby forming irregular asperity 10 (cf. FIG. 6). In this step, as shown in FIG. 7, the n⁻ type semiconductor substrate 1 is placed in a chamber C, and the n⁻ type semiconductor substrate 1 is irradiated with the pulsed laser beam PL from a pulse laser generating device PLD located outside the chamber C. The chamber C has a gas inlet port $G_{IN}$ and a gas outlet port $G_{OUT}$ and an inert gas (e.g., nitrogen gas, argon gas, or the like) is introduced through the gas inlet port $G_{IN}$ and discharged through the gas outlet port $G_{OUT}$, thereby forming an inert gas flow $G_f$ in the chamber C. Dust and other materials made during the irradiation with the pulsed laser beam PL are discharged as trapped into the inert gas flow $G_f$, to the outside of the chamber C, thereby preventing processing debris, dust, and other materials from attaching to the n⁻ type semiconductor substrate 1.

Figure 8:
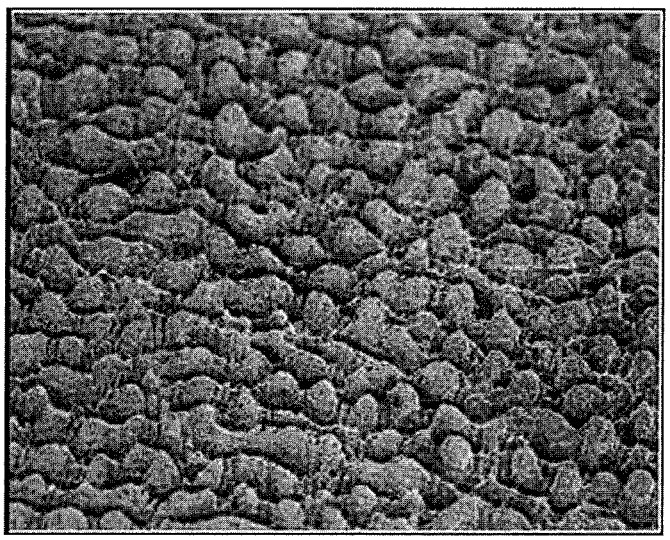
FIG. 8 is a drawing for explaining the manufacturing method of the photodiode according to the first embodiment.

In the present embodiment, the pulse laser generating device PLD to be used is a picosecond to femtosecond pulse laser generator and a picosecond to femtosecond pulsed laser beam is applied across the entire area of the second principal surface 1b. The second principal surface 1b is roughened by the picosecond to femtosecond pulsed laser beam, whereby the irregular asperity 10 is formed throughout the entire area of the second principal surface 1b, as shown in FIG. 8. The irregular asperity 10 has facets intersecting with a direction perpendicular to the first principal surface 1a. The height difference of asperity 10 is, for example, about 0.5 to 10 μm and the spacing of projections in the asperity 10 is about 0.5 to 10 μm. The picosecond to femtosecond pulsed laser beam has the pulse duration of, for example, about 50 fs-2 ps, the intensity of, for example, about 4 to 16 GW, and the pulse energy of, for example, about 200 to 800 μJ/pulse. More generally, the peak intensity is $3 \times 10^{11}$ to $2.5 \times 10^{13}$ (W/cm²) and the fluence is about 0.1 to 1.3 (J/cm²). FIG. 8 is an SEM image resulting from observation of the irregular asperity 10 formed in the second principal surface 1b.

Figure 9:
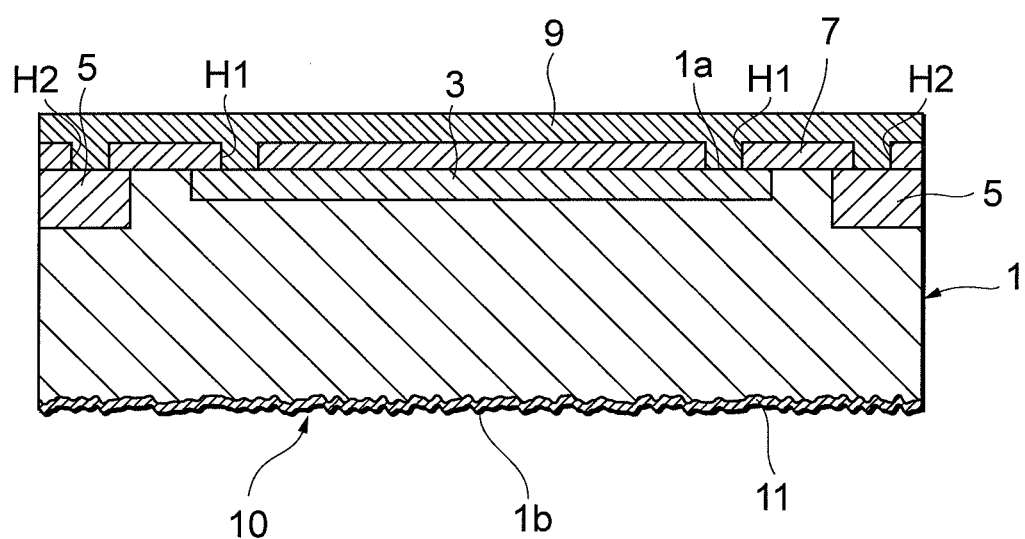
FIG. 9 is a drawing for explaining the manufacturing method of the photodiode according to the first embodiment.

Next, an accumulation layer 11 is formed on the second principal surface 1b side of the n⁻ type semiconductor substrate 1 (cf. FIG. 9). In this step, the accumulation layer 11 is formed by ion implantation or diffusion of an n-type impurity from the second principal surface 1b side in the n⁻ type semiconductor substrate 1 so that an impurity concentration thereof becomes higher than that of the n⁻ type semiconductor substrate 1. The accumulation layer 11 has the thickness of, for example, about 1 μm.

Next, the n⁻ type semiconductor substrate 1 is subjected to a thermal treatment (annealing). In this step, the n⁻ type semiconductor substrate 1 is heated, for example, in the temperature range of about 800 to 1000° C. under an ambiance of $N_2$ gas for about 0.5 to 1 hour.

Figure 10:
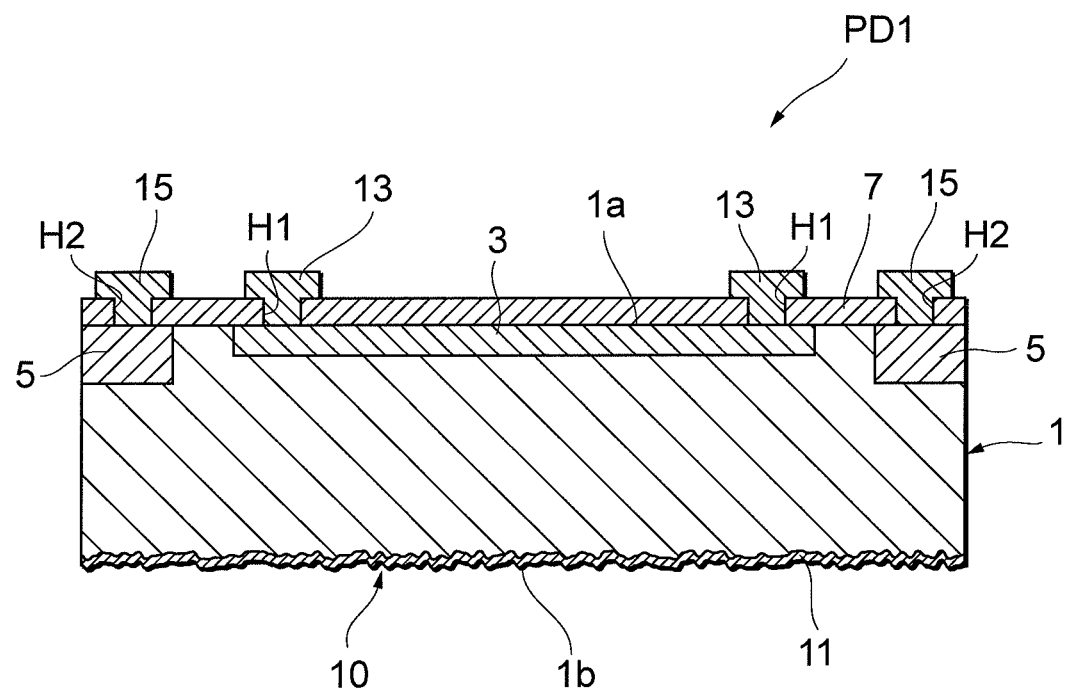
FIG. 10 is a drawing for explaining the manufacturing method of the photodiode according to the first embodiment.

Next, the passivation layer 9 formed on the insulating layer 7 is removed and thereafter electrodes 13, 15 are formed (cf. FIG. 10). The electrode 13 is formed in the contact hole H1 and the electrode 15 in the contact hole H2. The electrodes 13, 15 each are comprised of aluminum (Al) or the like and have the thickness of, for example, about 1 μm. This completes the photodiode PD1.

The photodiode PD1 is provided with the n⁻ type semiconductor substrate 1, as shown in FIG. 10. The p⁺ type semiconductor region 3 and the n⁺ type semiconductor region 5 are formed on the first principal surface 1a side of the n⁻ type semiconductor substrate 1 and a pn junction is formed between the n⁻ type semiconductor substrate 1 and the p⁺ type semiconductor region 3. The electrode 13 is in electrical contact with and connection to the p⁺ type semiconductor region 3 through the contact hole H1. The electrode 15 is in electrical contact with and connection to the n⁺ type semiconductor region 5 through the contact hole H2.

The irregular asperity 10 is formed in the second principal surface 1b of then n⁻ type semiconductor substrate 1. The accumulation layer 11 is formed on the second principal surface 1b side of the n⁻ type semiconductor substrate 1 and the second principal surface 1b is optically exposed. That the second principal surface 1b is optically exposed encompasses not only the case where the second principal surface 1b is in contact with ambient gas such as air, but also the case where an optically transparent film is formed on the second principal surface 1b.

Figure 11:
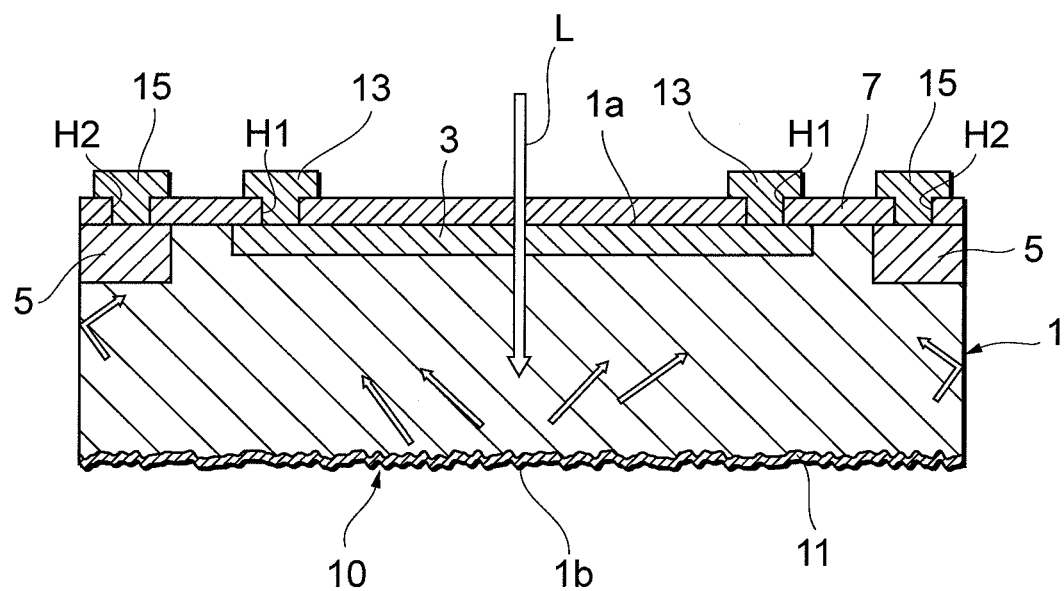
FIG. 11 is a drawing showing a configuration of the photodiode according to the first embodiment.

In the photodiode PD1, since the irregular asperity 10 is formed in the second principal surface 1b, light L incident into the photodiode PD1 is reflected, scattered, or diffused by the asperity 10, as shown in FIG. 11, to travel through a long distance in the n⁻ type semiconductor substrate 1.

Normally, Si has the refractive index n=3.5 and air the refractive index n=1.0. In a photodiode, when light is incident from a direction normal to a light incident surface, light remaining unabsorbed in the photodiode (silicon substrate) is separated into a light component reflected on the back surface to the light incident surface and a light component passing through the photodiode. The light passing through the photodiode does not contribute to the sensitivity of the photodiode. The light component reflected on the back surface to the light incident surface, if absorbed in the photodiode, becomes a photocurrent and a light component still remaining unabsorbed is reflected or transmitted by the light incident surface as the light component having reached the back surface to the light incident surface was.

In the photodiode PD1, where light L is incident from the direction normal to the light incident surface (first principal surface 1a), when the light reaches the irregular asperity 10 formed in the second principal surface 1b, light components arriving thereat at angles of not less than 16.6° to a direction of emergence from the asperity 10 are totally reflected by the asperity 10. Since the asperity 10 is formed irregularly, it has various angles to the emergence direction and the totally reflected light components diffuse into various directions. For this reason, the totally reflected light components include light components absorbed inside the n⁻ type semiconductor substrate 1 and light components arriving at the first principal surface 1a and side faces.

Since the light components arriving at the first principal surface 1a and side faces travel in various directions because of the diffusion on the asperity 10, the light components arriving at the first principal surface 1a and the side faces are highly likely to be totally reflected on the first principal surface 1a and the side faces. The light components totally reflected on the first principal surface 1a and the side faces are repeatedly totally reflected on different faces to further increase their travel distance. In this manner, the light L incident into the photodiode PD1 is absorbed in the n⁻ type semiconductor substrate 1 during travel through the long distance inside the n⁻ type semiconductor substrate 1 to be detected as a photocurrent.

As described above, the light L incident into the photodiode PD1 mostly travels, without being transmitted by the photodiode PD1, through the long travel distance to be absorbed in the n⁻ type semiconductor substrate 1. Therefore, the photodiode PD1 is improved in the spectral sensitivity characteristic in the near-infrared wavelength band.

If a regular asperity is formed in the second principal surface 1b, the light components arriving at the first principal surface 1a and the side faces are diffused by the asperity but travel in uniform directions; therefore, the light components arriving at the first principal surface 1a and the side faces are less likely to be totally reflected on the first principal surface 1a and the side faces. This results in increase in light passing through the first principal surface 1a and the side faces, and through the second principal surface 1b, and thus the travel distance of the light incident into the photodiode must be short. For this reason, it becomes difficult to improve the spectral sensitivity characteristic in the near-infrared wavelength band.

An experiment was conducted in order to check the effect of improvement in the spectral sensitivity characteristic in the near-infrared wavelength band by the first embodiment.

We fabricated a photodiode with the above-described configuration (referred to as Example 1) and a photodiode without the irregular asperity in the second principal surface of the n⁻ type semiconductor substrate (referred to as Comparative Example 1), and investigated their spectral sensitivity characteristics. Example 1 and Comparative Example 1 have the same configuration, except for the formation of the irregular asperity by irradiation with the pulsed laser beam. The size of the n⁻ type semiconductor substrate 1 was set to 6.5 mm×6.5 mm. The size of the p⁺ type semiconductor region 3, or a photosensitive region was set to 5.8 mm×5.8 mm. A bias voltage VR applied to the photodiodes was set to 0 V.

Figure 12:
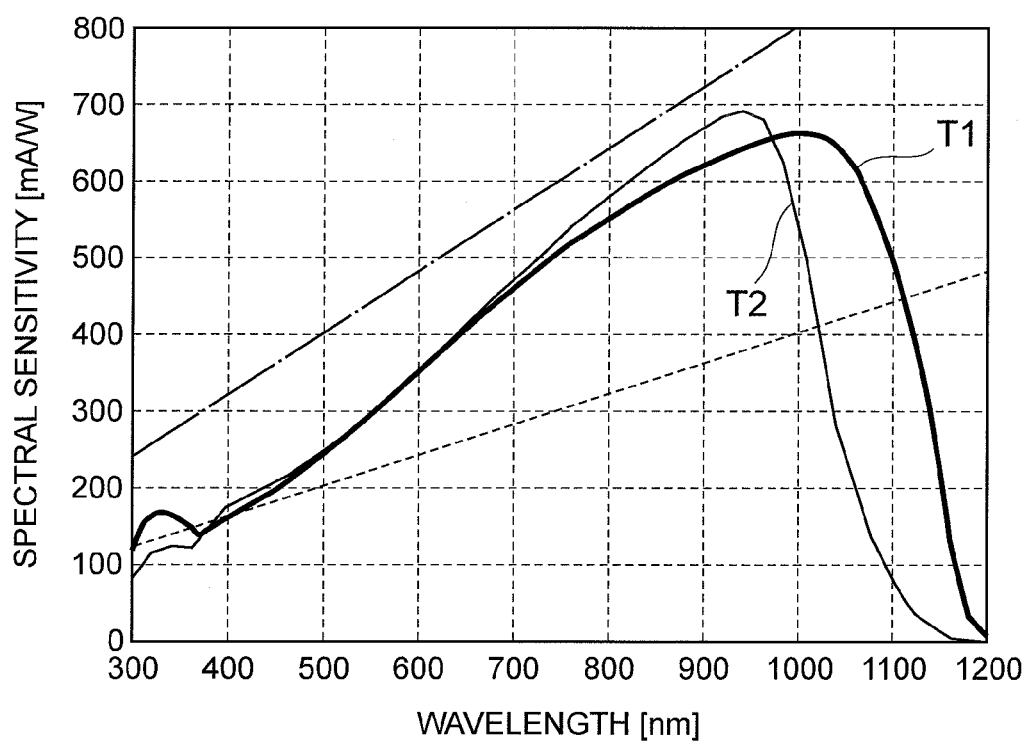
FIG. 12 is a diagram showing changes of spectral sensitivity versus wavelength in Example 1 and Comparative Example 1.

The results are shown in FIG. 12. In FIG. 12, the spectral sensitivity characteristic of Example 1 is represented by T1 and the spectral sensitivity characteristic of Comparative Example 1 by characteristic T2. In FIG. 12, the vertical axis represents the spectral sensitivity (mA/W) and the horizontal axis the wavelength of light (nm). A characteristic indicated by a chain line represents a spectral sensitivity characteristic where the quantum efficiency (QE) is 100%, and a characteristic indicated by a dashed line, a spectral sensitivity characteristic where the quantum efficiency is 50%.

As seen from FIG. 12, for example at 1064 nm, the spectral sensitivity in Comparative Example 1 is 0.2 A/W (QE=25%), whereas the spectral sensitivity in Example 1 is 0.6 A/W (QE=72%); thus the spectral sensitivity in the near-infrared wavelength band is drastically improved.

Figure 13:
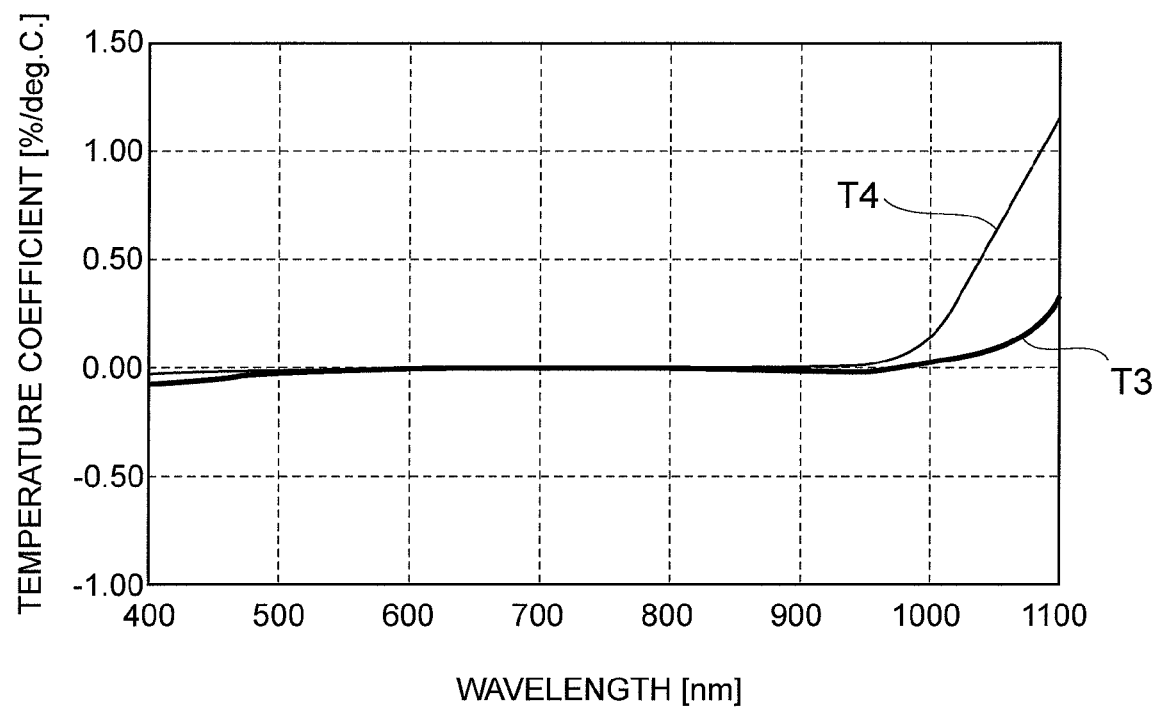
FIG. 13 is a diagram showing changes of temperature coefficient versus wavelength in Example 1 and Comparative Example 1.

We also checked temperature characteristics of spectral sensitivity in Example 1 and Comparative Example 1. We investigated the spectral sensitivity characteristics with increase in ambient temperature from 25° C. to 60° C. and calculated a rate (temperature coefficient) of spectral sensitivity at 60° C. to spectral sensitivity at 25° C. The results are shown in FIG. 13. In FIG. 13, the characteristic of temperature coefficient of Example 1 is represented by T3 and that of Comparative Example 1 by characteristic T4. In FIG. 13, the vertical axis represents the temperature coefficient (%/° C.) and the horizontal axis the wavelength of light (nm).

As seen from FIG. 13, for example at 1064 nm, the temperature coefficient in Comparative Example 1 is 0.7%/° C., whereas the temperature coefficient in Example 1 is 0.2%/° C., demonstrating lower temperature dependence. In general, an increase in temperature leads to an increase in spectral sensitivity because of increase in absorption coefficient and decrease in bandgap energy. In Example 1, since the spectral sensitivity is sufficiently high even at room temperature, the change of spectral sensitivity due to temperature rise is smaller than in Comparative Example 1.

In the photodiode PD1, the accumulation layer 11 is formed on the second principal surface 1b side of the n⁻ type semiconductor substrate 1. This induces recombination of unwanted carriers generated independent of light on the second principal surface 1b side, which can reduce dark current. Furthermore, the accumulation layer 11 prevents carriers generated by light near the second principal surface 1b, from being trapped in the second principal surface 1b. For this reason, the carriers generated by light efficiently migrate to the pn junction part, which can further improve the photodetection sensitivity of the photodiode PD1.

In the first embodiment, after the formation of the accumulation layer 11, the n⁻ type semiconductor substrate 1 is subjected to the thermal treatment. This treatment restores the crystallinity of the n⁻ type semiconductor substrate 1, which can prevent such a problem as increase of dark current.

In the first embodiment, after the thermal treatment of the n⁻ type semiconductor substrate 1, the electrodes 13, 15 are formed. This prevents the electrodes 13, 15 from melting during the thermal treatment, even in the case where the electrodes 13, 15 are made of a metal with a relatively low melting point; therefore, the electrodes 13, 15 can be appropriately formed without being affected by the thermal treatment.

In the first embodiment, the irregular asperity 10 is formed by the irradiation with the picosecond to femtosecond pulsed laser beam. This permits the irregular asperity 10 to be appropriately and readily formed.

Second Embodiment

Figure 14:
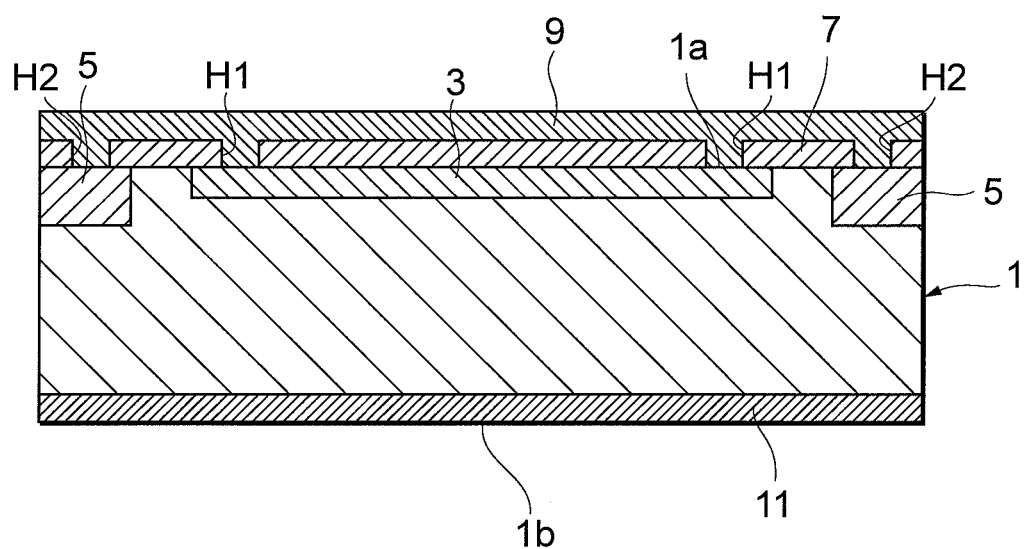
FIG. 14 is a drawing for explaining a manufacturing method of a photodiode according to the second embodiment.
Figure 15:
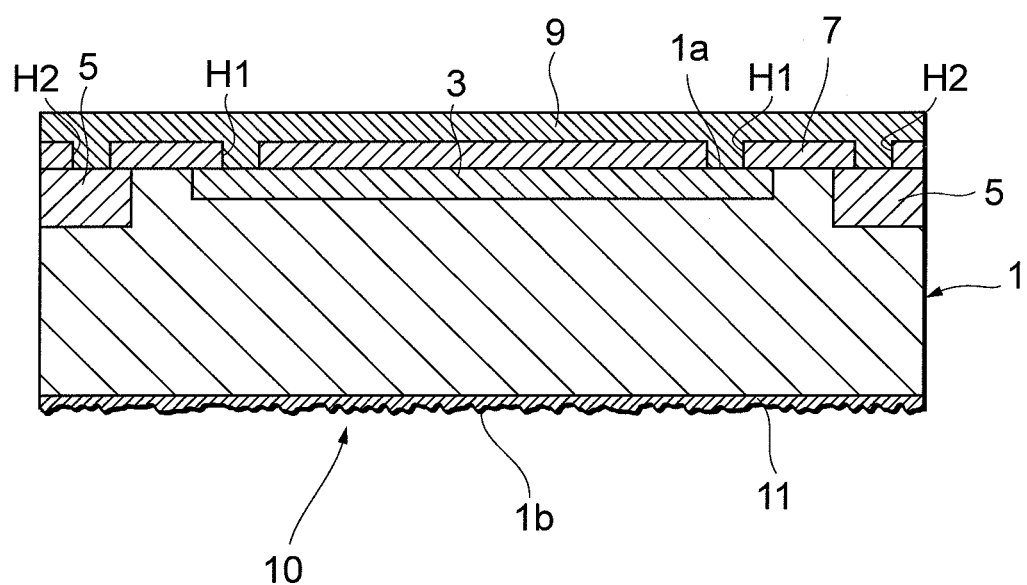
FIG. 15 is a drawing for explaining the manufacturing method of the photodiode according to the second embodiment.
Figure 16:
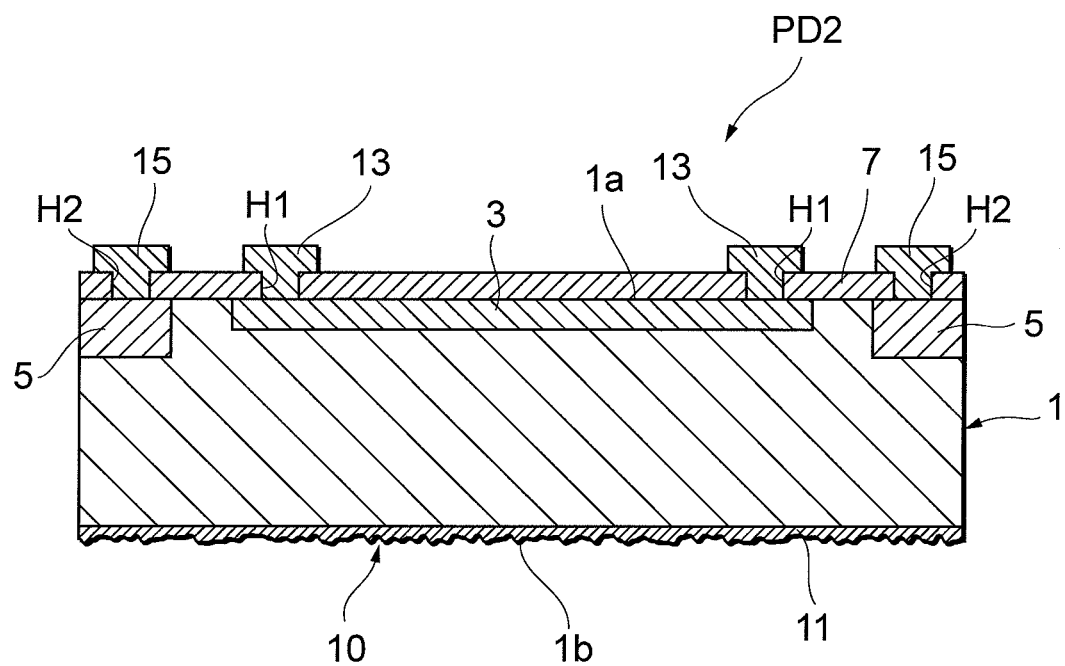
FIG. 16 is a drawing for explaining the manufacturing method of the photodiode according to the second embodiment.
Figure 17:
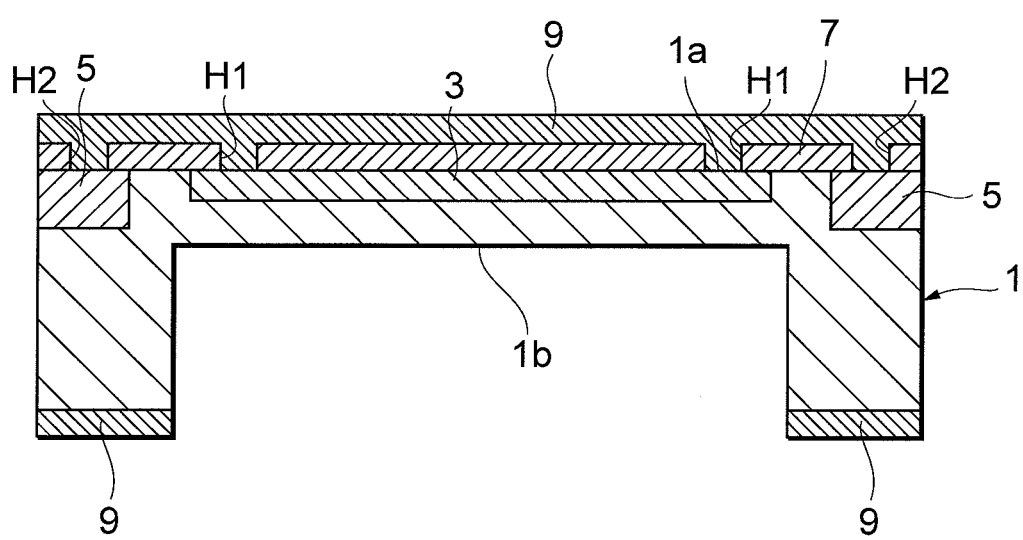
FIG. 17 is a drawing for explaining a manufacturing method of a photodiode according to the third embodiment.

A method for manufacturing a photodiode according to the second embodiment will be described with reference to FIGS. 14 to 16. FIGS. 14 to 16 are drawings for explaining the manufacturing method of the photodiode according to the second embodiment.

The manufacturing method of the second embodiment, up to the polishing of the n⁻ type semiconductor substrate 1 from the second principal surface 1b side, is the same as the manufacturing method of the first embodiment, and the description of the previous steps before it is omitted herein. After the n⁻ type semiconductor substrate 1 is polished from the second principal surface 1b side to obtain the n⁻ type semiconductor substrate 1 in the desired thickness, the accumulation layer 11 is formed on the second principal surface 1b side of the n⁻ type semiconductor substrate 1 (cf. FIG. 14). The formation of the accumulation layer 11 is carried out in the same manner as in the first embodiment. The accumulation layer 11 has the thickness of, for example, about 1 μm.

Next, the second principal surface 1b of the n⁻ type semiconductor substrate 1 is irradiated with the pulsed laser beam PL to form the irregular asperity 10 (cf. FIG. 15). The formation of the irregular asperity 10 is carried out in the same manner as in the first embodiment.

Next, as in the first embodiment, the n⁻ type semiconductor substrate 1 is subjected to a thermal treatment. Thereafter, after removal of the passivation layer 9 formed on the insulating layer 7, the electrodes 13, 15 are formed (cf. FIG. 16). This completes the photodiode PD2.

In the second embodiment, like the first embodiment, the travel distance of light incident into the photodiode PD2 also becomes long and the distance of absorption of light also becomes long, which can improve the spectral sensitivity characteristic in the near-infrared wavelength band.

In the second embodiment, the thickness of the accumulation layer 11 is made larger than the height difference of the irregular asperity 10. For this reason, even if the irregular asperity 10 is formed by the irradiation with the pulsed laser beam after the formation of the accumulation layer 11, the accumulation layer 11 remains with certainty. Therefore, it is feasible to ensure the operational effect by the accumulation layer 11.

Third Embodiment

A method for manufacturing a photodiode according to the third embodiment will be described with reference to FIGS. 17 to 21. FIGS. 17 to 21 are drawings for explaining the manufacturing method of the photodiode according to the third embodiment.

The manufacturing method of the third embodiment, up to the formation of the passivation layer 9, is the same as the manufacturing method of the first embodiment, and the description of the previous steps before it is omitted herein. After the formation of the passivation layer 9, a portion corresponding to the p⁺ type semiconductor region 3 in the n⁻ type semiconductor substrate 1 is thinned from the second principal surface 1b side while leaving a peripheral region around the thinned portion (cf. FIG. 17). The thinning of the n⁻ type semiconductor substrate 1 is carried out, for example, by anisotropic etching based on alkali etching using a potassium hydroxide solution, TMAH (tetramethylammonium hydroxide solution), or the like. The thinned portion of the n⁻ type semiconductor substrate 1 has the thickness of, for example, about 100 μm, and the peripheral portion around it has the thickness of, for example, about 300 μm.

Figure 18:
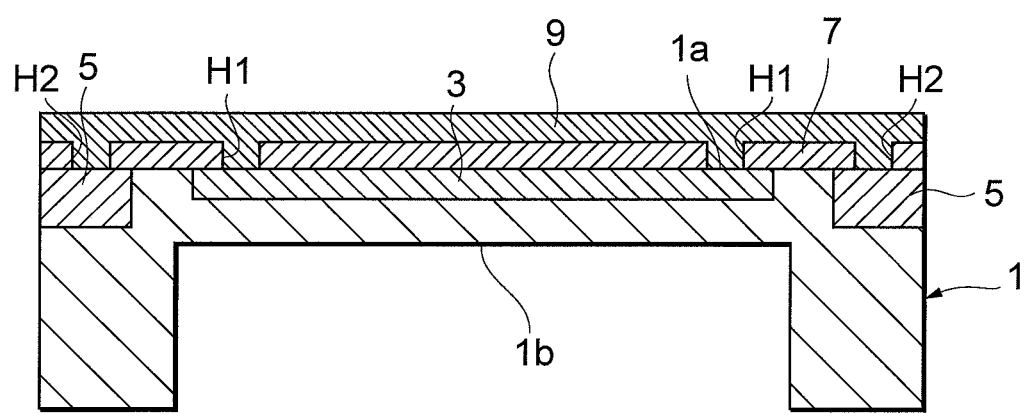
FIG. 18 is a drawing for explaining the manufacturing method of the photodiode according to the third embodiment.

Next, the n⁻ type semiconductor substrate 1 is polished from the second principal surface 1b side before the thickness of the peripheral portion of the n⁻ type semiconductor substrate 1 reaches a desired thickness (cf. FIG. 18). The desired thickness herein is, for example, 270 μm.

Figure 19:
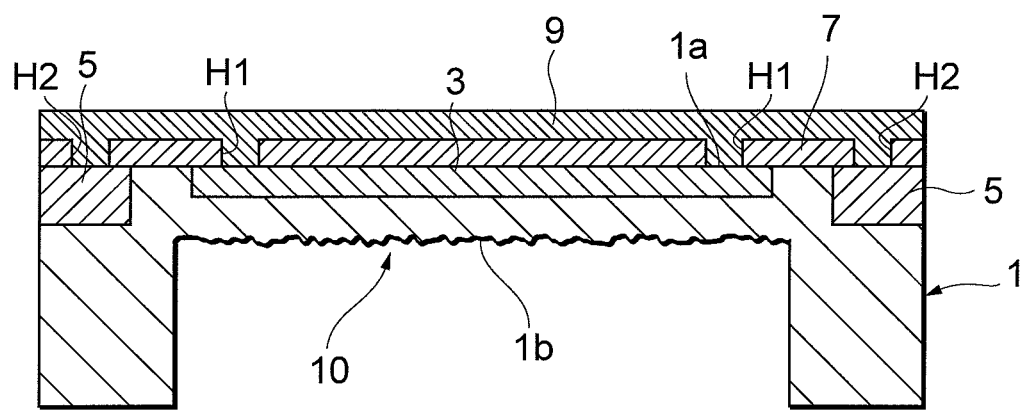
FIG. 19 is a drawing for explaining the manufacturing method of the photodiode according to the third embodiment.

Next, the second principal surface 1b of the n⁻ type semiconductor substrate 1 is irradiated with the pulsed laser beam PL to form the irregular asperity 10 (cf. FIG. 19). The formation of the irregular asperity 10 is carried out in the same manner as in the first embodiment.

Figure 20:
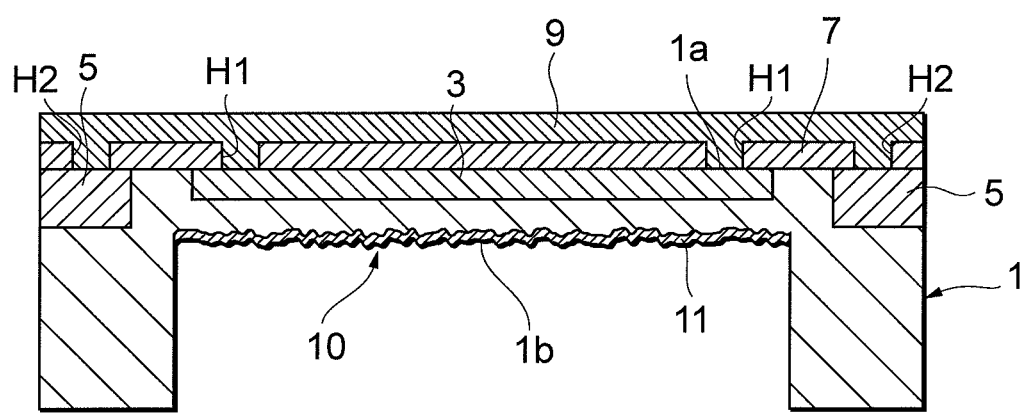
FIG. 20 is a drawing for explaining the manufacturing method of the photodiode according to the third embodiment.

Next, the accumulation layer 11 is formed on the second principal surface 1b side of the thinned portion of the n⁻ type semiconductor substrate 1 (cf. FIG. 20). The formation of the accumulation layer 11 is carried out in the same manner as in the first embodiment. The accumulation layer 11 has the thickness of, for example, about 3 μm.

Figure 21:
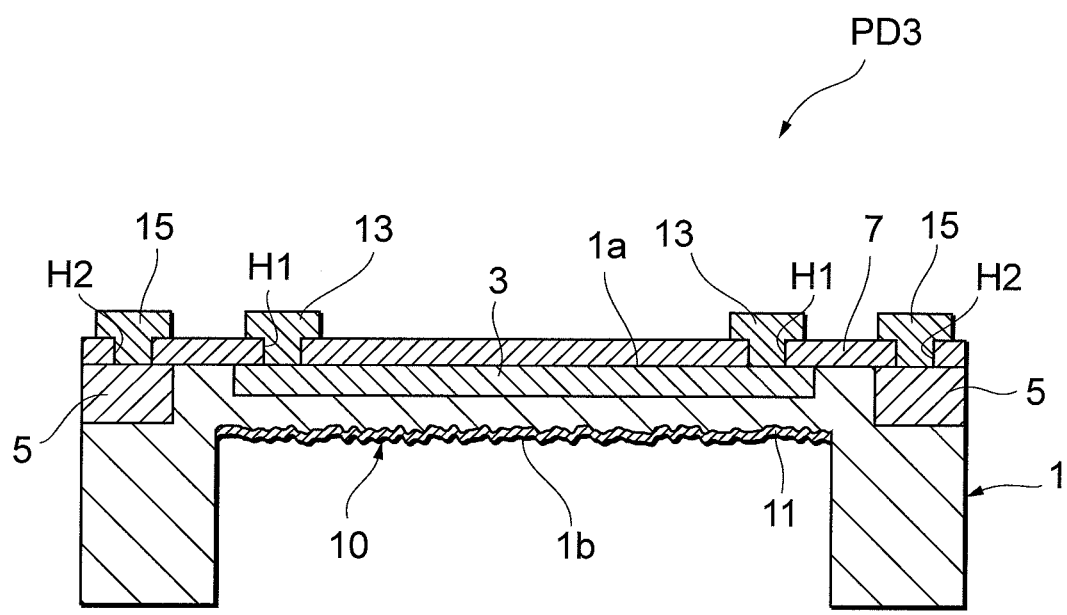
FIG. 21 is a drawing for explaining the manufacturing method of the photodiode according to the third embodiment.

Next, as in the first embodiment, the n⁻ type semiconductor substrate 1 is subjected to a thermal treatment and thereafter, the passivation layer 9 formed on the insulating layer 7 is removed, followed by formation of the electrodes 13, 15 (cf. FIG. 21). This completes the photodiode PD3.

In the third embodiment, like the first and second embodiments, the travel distance of light incident into the photodiode PD3 also becomes long and the distance of absorption of light also becomes long, which can improve the spectral sensitivity characteristic in the near-infrared wavelength band.

In the third embodiment, prior to the formation of the irregular asperity 10, the portion corresponding to the p⁺ type semiconductor region 3 in the n⁻ type semiconductor substrate 1 is thinned from the second principal surface 1b side while leaving the peripheral portion around the thinned portion. This permits the photodiode PD3 to be formed with respective light incident surfaces on the first principal surface 1a and the second principal surface 1b sides of the n⁻ type semiconductor substrate 1.

Fourth Embodiment

Figure 22:
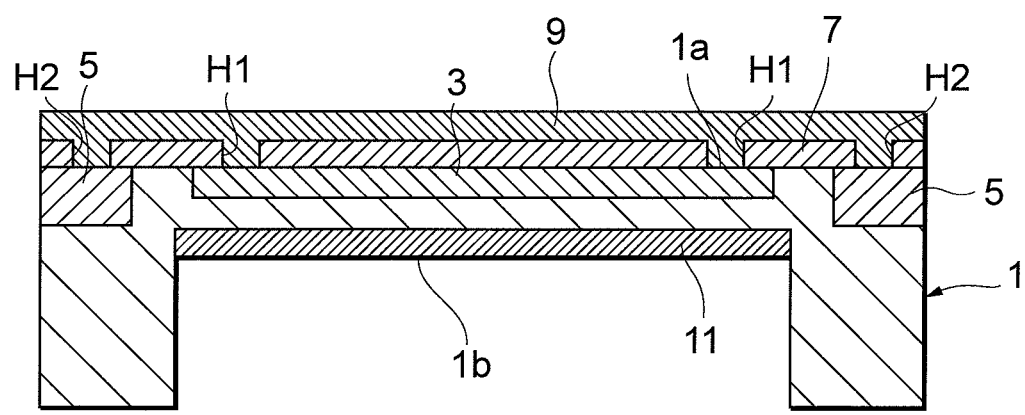
FIG. 22 is a drawing for explaining a manufacturing method of a photodiode according to the fourth embodiment.
Figure 23:
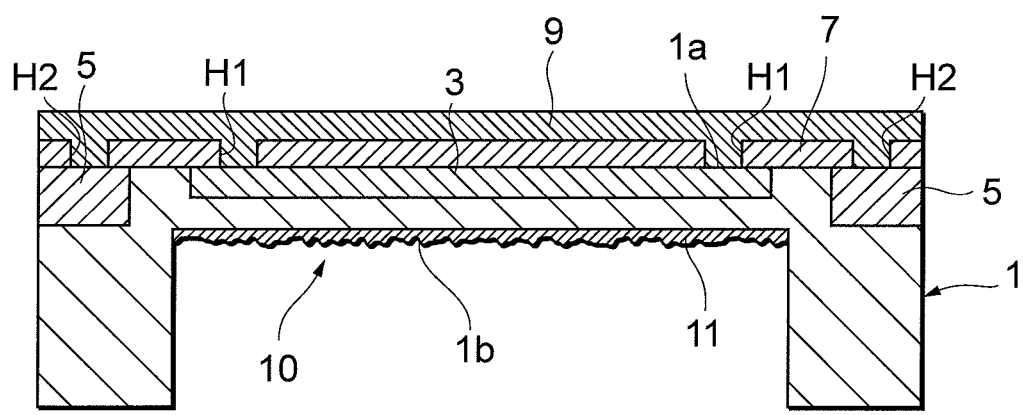
FIG. 23 is a drawing for explaining the manufacturing method of the photodiode according to the fourth embodiment.
Figure 24:
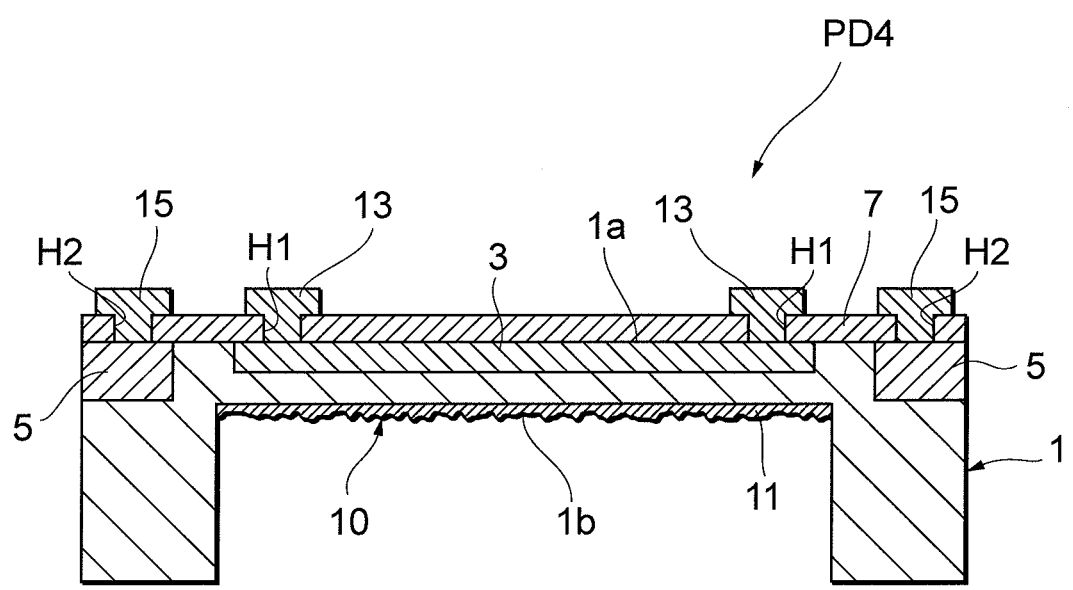
FIG. 24 is a drawing for explaining the manufacturing method of the photodiode according to the fourth embodiment.

A method for manufacturing a photodiode according to the fourth embodiment will be described with reference to FIGS. 22 to 24. FIGS. 22 to 24 are drawings for explaining the manufacturing method of the photodiode according to the fourth embodiment.

The manufacturing method of the fourth embodiment, up to the thinning of the n⁻ type semiconductor substrate 1, is the same as the manufacturing method of the third embodiment, and the description of the previous steps before it is omitted herein. After the n⁻ type semiconductor substrate 1 is polished from the second principal surface 1b side to obtain the n⁻ type semiconductor substrate 1 in the desired thickness, the accumulation layer 11 is formed on the second principal surface 1b side of the thinned portion of the n⁻ type semiconductor substrate 1 (cf. FIG. 22). The formation of the accumulation layer 11 is carried out in the same manner as in the first embodiment. The accumulation layer 11 has the thickness of, for example, about 3 µm.

Next, the second principal surface 1b of the n⁻ type semiconductor substrate 1 is irradiated with the pulsed laser beam PL to form the irregular asperity 10 (cf. FIG. 23). The formation of the irregular asperity 10 is carried out in the same manner as in the first embodiment.

Next, the n⁻ type semiconductor substrate 1 is subjected to a thermal treatment as in the first embodiment. Then the passivation layer 9 formed on the insulating layer 7 is removed and thereafter, the electrodes 13, 15 are formed (cf. FIG. 24). This completes the photodiode PD4.

In the fourth embodiment, like the first to third embodiments, the travel distance of light incident into the photodiode PD4 also becomes long and the distance of absorption of light also becomes long, which can improve the spectral sensitivity characteristic in the near-infrared wavelength band.

In the fourth embodiment, prior to the formation of the accumulation layer 11, the portion corresponding to the p⁺ type semiconductor region 3 in the n⁻ type semiconductor substrate 1 is thinned from the second principal surface 1b side while leaving the peripheral portion around the thinned portion. This permits the photodiode PD4 to be formed with respective light incident surfaces on the first principal surface 1a and the second principal surface 1b sides of the n⁻ type semiconductor substrate 1.

Fifth Embodiment

Figure 25:
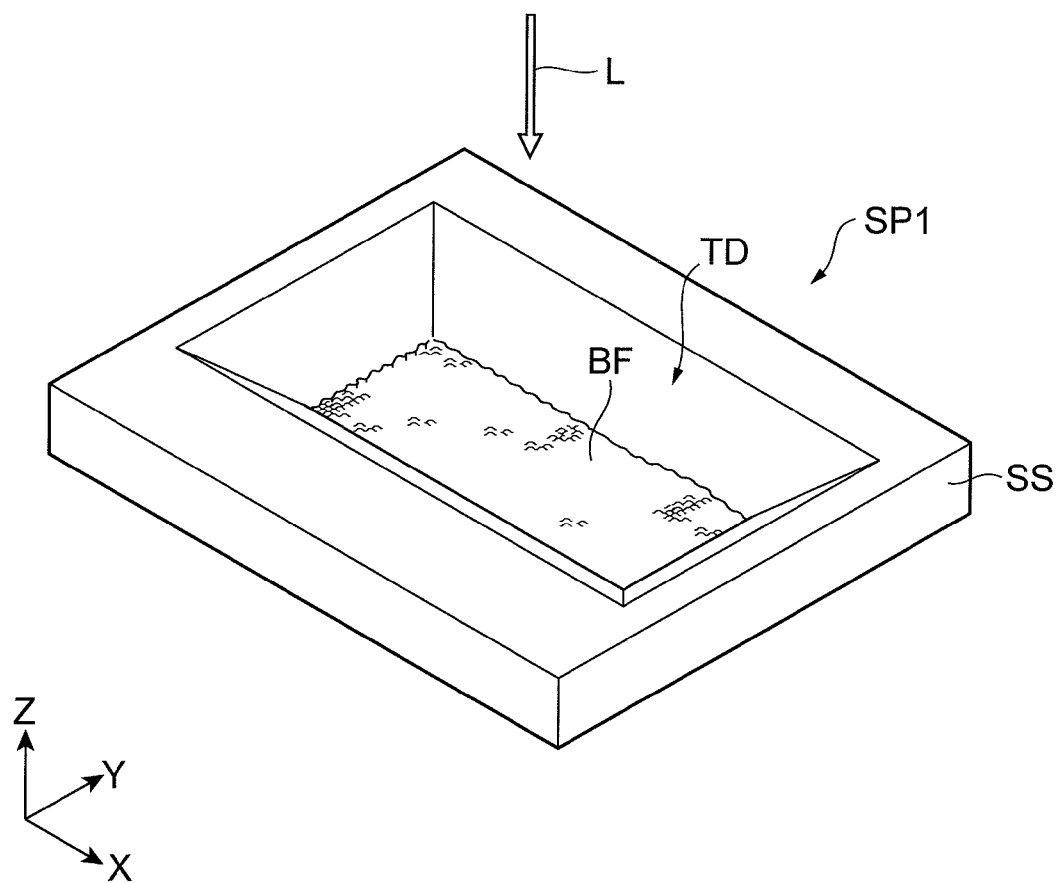
FIG. 25 is a perspective view showing a semiconductor photodetection element according to the fifth embodiment.
Figure 26:
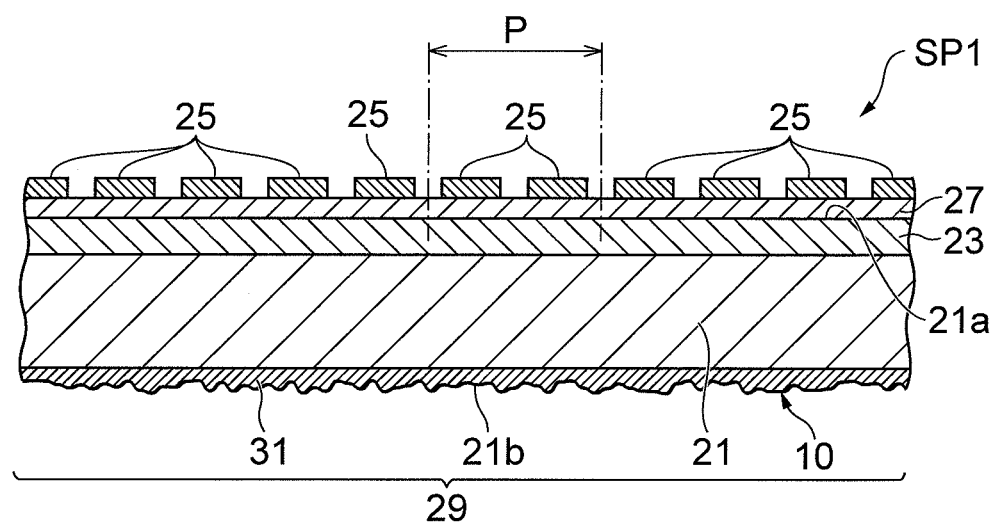
FIG. 26 is a drawing for explaining a cross-sectional configuration of the semiconductor photodetection element according to the fifth embodiment.

A semiconductor photodetection element SP1 according to the fifth embodiment will be described with reference to FIGS. 25 and 26. FIG. 25 is a perspective view showing the semiconductor photodetection element according to the fifth embodiment. FIG. 26 is a drawing for explaining a cross-sectional configuration of the semiconductor photodetection element according to the fifth embodiment.

The semiconductor photodetection element SP1, as shown in FIG. 25, is a back-thinned type solid-state imaging device and BT-CCD (charged coupled device) obtained by thinning the back side of semiconductor substrate SS by etching with a KOH aqueous solution or the like. A recess portion TD is formed in a central region of the etched semiconductor substrate SS and a thick frame portion exists around the recess portion TD. Side faces of the recess portion TD are inclined at obtuse angles relative to a bottom face BF. The thinned central region of the semiconductor substrate SS is a photosensitive region (imaging region) and light L is incident along the negative direction of Z-axis into this photosensitive region. The bottom face BF of the recess portion TD of the semiconductor substrate SS constitutes a light incident surface. The frame portion may be removed by etching to obtain a back-thinned type solid-state imaging device the entire region of which is thinned.

The semiconductor photodetection element SP1 is provided with a p-type semiconductor substrate 21 as the foregoing semiconductor substrate SS. The p-type semiconductor substrate 21 is comprised of silicon (Si) crystal and has a first principal surface 21a and a second principal surface 21b opposed to each other. The p-type semiconductor substrate 21 has the thickness set to not more than the pixel pitch P. In the present embodiment, the pixel pitch P is about 10 to 48 µm and the thickness of the p-type semiconductor substrate 21 is about 10 to 30 µm. The present embodiment shows an example of two-phase clock driving and under each transfer electrode, there are regions of different impurity concentrations (not shown) in order to ensure unidirectional transfer of charge.

An n-type semiconductor layer 23 as a charge transfer part is formed on the first principal surface 21a side of the p-type semiconductor substrate 21, and therefore a pn junction is formed between the p-type semiconductor substrate 21 and the n-type semiconductor layer 23. A plurality of charge transfer electrodes 25 as a transfer electrode part are provided through an insulating layer 27 on the first principal surface 21a of the p-type semiconductor substrate 21. On the first principal surface 21a side of the p-type semiconductor substrate 21, isolation layers for electrically separating the n-type semiconductor layer 23 into regions for respective vertical CCDs are also formed though not shown. The n-type semiconductor layer 23 has the thickness of about 0.5 µm.

The irregular asperity 10 is formed throughout an entire photosensitive region 29 in the second principal surface 21b of the p-type semiconductor substrate 21. An accumulation layer 31 is formed on the second principal surface 21b side of the p-type semiconductor substrate 21 and the second principal surface 21b is optically exposed. That the second principal surface 21b is optically exposed embraces not only the case where the second principal surface 21b is in contact with ambient gas such as air, but also the case where an optically transparent film is formed on the second principal surface 21b. When the semiconductor photodetection element SP1 is a back-thinned type solid-state imaging device wholly thinned, the irregular asperity 10 may be formed throughout the entire area of the second principal surface 21b of the p-type semiconductor substrate 21. When the semiconductor photodetection element SP1 is a back-thinned type solid-state imaging device wherein only a portion near the photosensitive region 29 is thinned, the irregular asperity 10 may be formed throughout the entire area of the second principal surface 21b including the peripheral frame portion not thinned in the p-type semiconductor substrate 21, and the inclined faces connected to the frame portion.

Figure 30:
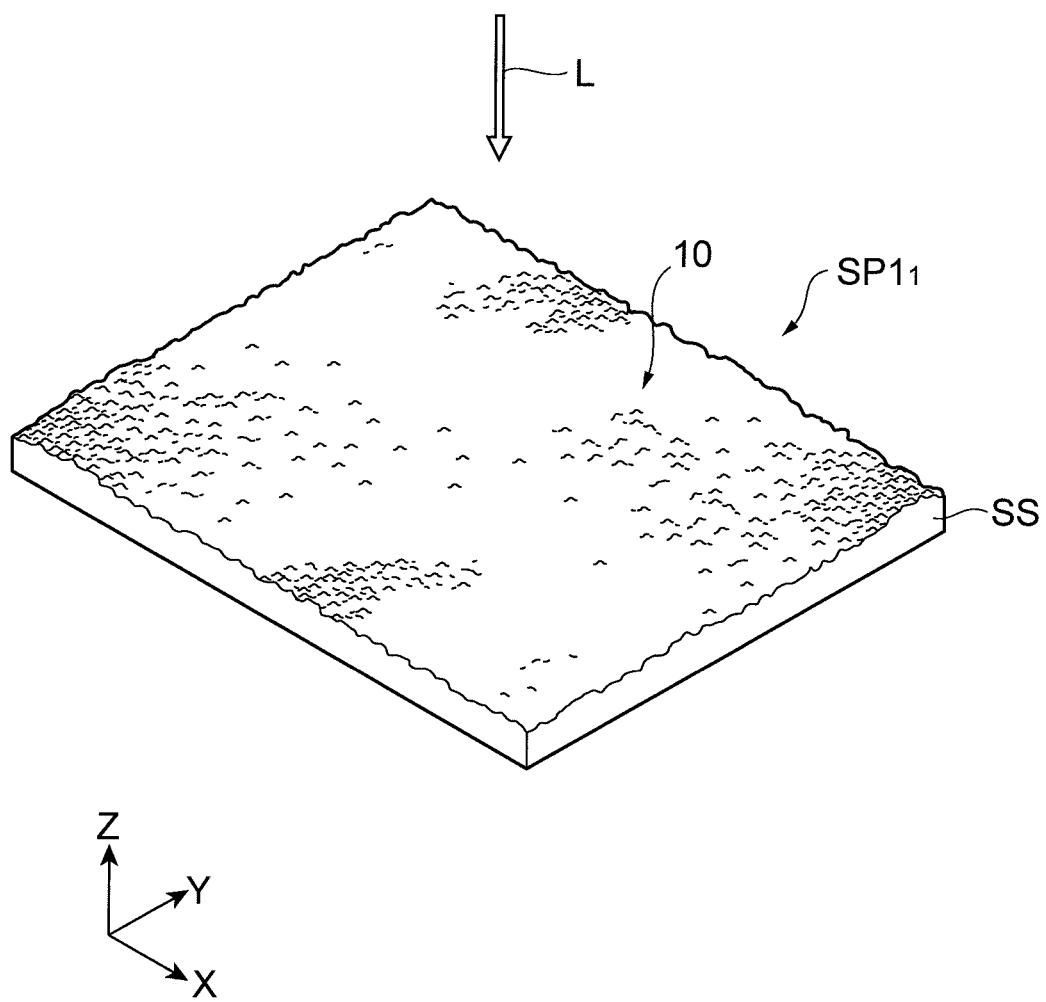
FIG. 30 is a perspective view showing a semiconductor photodetection element according to a modification example of the fifth embodiment.

The back-thinned type solid-state imaging device wholly thinned can be obtained by providing no frame portion, gluing another substrate to a front surface of the semiconductor substrate SS, and thereafter polishing the back side of the semiconductor substrate SS. As shown in FIG. 30, a semiconductor photodetection element SP1₁ is thinned throughout the entire back side of the semiconductor substrate SS. In the semiconductor photodetection element SP1₁, the irregular asperity 10 is formed at least in a region corresponding to the photosensitive region on the back side (second principal surface) of the semiconductor substrate SS, and the aforementioned accumulation layer (not shown) is formed on the back side of the semiconductor substrate SS.

A method for manufacturing the semiconductor photodetection element SP1 of the present embodiment will be described below.

First, the p-type semiconductor substrate 21 is prepared and the n-type semiconductor layer 23 is formed on the first principal surface 21a side of the p-type semiconductor substrate 21. The n-type semiconductor layer 23 is formed by diffusion of an n-type impurity from the first principal surface 21a side in the p-type semiconductor substrate 21.

Next, the accumulation layer 31 is formed on the second principal surface 21b side of the p-type semiconductor substrate 21. The accumulation layer 31 is formed by ion implantation or diffusion of a p-type impurity from the second principal surface 21b side in the p-type semiconductor substrate 21 so that an impurity concentration thereof becomes higher than that of the p-type semiconductor substrate 21, as in the aforementioned embodiment. The accumulation layer 31 has the thickness of, for example, about 0.5 µm. The accumulation layer 31 may be formed before the formation of the irregular asperity 10 or may be formed after the formation of the irregular asperity 10.

Next, the p-type semiconductor substrate 21 is thinned as described above. In the case where the accumulation layer 31 is formed after the formation of the irregular asperity 10, the p-type semiconductor substrate 21 is thinned after the formation of the irregular asperity 10 and thereafter, the accumulation layer 31 is formed.

Next, the p-type semiconductor substrate 21 is subjected to a thermal treatment to activate the accumulation layer 31. The thermal treatment is carried out, for example, in the temperature range of about 800 to 1000° C. under an ambiance of $N_2$ gas for about 0.5 to 1.0 hour. At this time, the crystallinity of the p-type semiconductor substrate 21 is also restored.

Next, the irregular asperity 10 is formed on the second principal surface 21b side of the p-type semiconductor substrate 21. The irregular asperity 10 is formed by irradiating the second principal surface 21b of the p-type semiconductor substrate 21 with the pulsed laser beam, as in the aforementioned embodiment. A pulse laser diode to be used for the irradiation with the pulsed laser beam may be a picosecond to femtosecond pulse laser generator. The irregular asperity 10 has faces intersecting with the direction perpendicular to the first principal surface 21a. The asperity 10 has the height difference of, for example, about 0.5 to 10 μm, and the spacing of projections in the asperity 10 is about 0.5 to 10 μm. The picosecond to femtosecond pulsed laser beam has the pulse duration of, for example, about 50 fs to 2 ps, the intensity of, for example, about 4 to 16 GW, and the pulse energy of, for example, about 200 to 800 μJ/pulse. More generally, the peak intensity is $3 \times 10^{11}$ to $2.5 \times 10^{13}$ (W/cm$^2$) and the fluence is about 0.1 to 1.3 (J/cm$^2$).

Next, the p-type semiconductor substrate 21 is subjected to a thermal treatment. The thermal treatment is carried out, for example, in the temperature range of about 800 to 1000° C. under an ambiance of $N_2$ gas for about 0.5 to 1.0 hour. The thermal treatment brings about restoration and recrystallization of crystal defects in the p-type semiconductor substrate 21, which can prevent such a problem as increase in dark current. The thermal treatment after the formation of the accumulation layer 31 may be omitted, while only the thermal treatment after the formation of the irregular asperity 10 is carried out.

Next, the insulating layer 27 and charge transfer electrodes 25 are formed. Since steps of forming the insulating layer 27 and charge transfer electrodes 25 are known, the description thereof is omitted herein. The charge transfer electrodes 25 are comprised, for example, of polysilicon or metal. The insulating layer 27 is comprised, for example, of $SiO_2$. A protecting film may be further formed so as to cover the insulating layer 27 and the charge transfer electrodes 25. The protecting film is comprised, for example, of BPSG (Boron Phosphor Silicate Glass). This completes the semiconductor photodetection element SP1.

In the semiconductor photodetection element SP1, when light is incident to the light incident surface (second principal surface 21b), the incident light is scattered by the asperity 10 to travel in various directions in the p-type semiconductor substrate 21 because the irregular asperity 10 is formed in the second principal surface 21b. Since light components arriving at the first principal surface 21a and others travel in various directions because of the diffusion at the asperity 10, the light components arriving at the first principal surface 21a and others are highly likely to be totally reflected on the first principal surface 21a. The light components totally reflected on the first principal surface 21a and others are repeatedly totally reflected on different faces or, reflected, scattered, or diffused on the second principal surface 21b, whereby their travel distance becomes longer. In this manner, the light incident into the semiconductor photodetection element SP1 is reflected, scattered, or diffused by the asperity 10 to travel through a long distance in the p-type semiconductor substrate 21. While the light incident into the semiconductor photodetection element SP1 travels through the long distance inside the p-type semiconductor substrate 21, the light is absorbed in the p-type semiconductor substrate 21 and carriers generated by the light turn to charges at respective pixels of the n-type semiconductor layer 23 to be transferred and detected. Therefore, the semiconductor photodetection element SP1 is improved in the spectral sensitivity characteristic in the near-infrared wavelength band.

The semiconductor photodetection element SP1 has a risk of reduction in resolution due to occurrence of crosstalk between pixels resulting from reflection, scattering, or diffusion by the asperity 10. However, since the thickness of the p-type semiconductor substrate 21 is set to not more than the pixel pitch P, the occurrence of crosstalk between pixels can be suppressed in the semiconductor photodetection element SP1.

In the semiconductor photodetection element SP1, the accumulation layer 31 is formed on the second principal surface 21b side of the p-type semiconductor substrate 21. This induces recombination of unwanted carriers generated independent of light on the second principal surface 21b side, which can reduce dark current. The accumulation layer 31 prevents carriers generated by light near the second principal surface 21b from being trapped in the second principal surface 21b. For this reason, the carriers generated by light efficiently migrate to the pn junction, which can further improve the photodetection sensitivity of the semiconductor photodetection element SP1.

In the fifth embodiment, after the formation of the accumulation layer 31, the p-type semiconductor substrate 21 is subjected to the thermal treatment. This restores the crystallinity of the p-type semiconductor substrate 21, which can prevent such a problem as increase in dark current.

In the fifth embodiment, after the thermal treatment of the p-type semiconductor substrate 21, the charge transfer electrodes 25 are formed. This process prevents the charge transfer electrodes 25 from melting during the thermal treatment even in the case where the charge transfer electrodes 25 are made of a material with a relatively low melting point, whereby the charge transfer electrodes 25 can be appropriately formed without being affected by the thermal treatment.

In the fifth embodiment, the irregular asperity 10 is formed by the irradiation with the picosecond to femtosecond pulsed laser beam. This permits the irregular asperity 10 to be appropriately and readily formed.

Incidentally, in the case of the semiconductor photodetection element like the solid-state imaging device, it is possible to realize the semiconductor photodetection element with the spectral sensitivity characteristic in the near-infrared wavelength band, by setting the semiconductor substrate of silicon thick (e.g., about 200 μm). However, in the case of the semiconductor substrate having the increased thickness, it is necessary to apply a large bias voltage of about several ten V to completely deplete the semiconductor substrate, in order to achieve good resolution. The reason for it is to prevent the following phenomenon: if the semiconductor substrate is not completely depleted and a neutral region still remains in part of the semiconductor substrate, carriers generated in the neutral region will diffuse so as to degrade the resolution.

As the semiconductor substrate becomes thicker, the dark current also increases. For this reason, it is also necessary to cool the semiconductor substrate (e.g., at −70 to −100° C.), thereby to suppress the increase in dark current.

In the semiconductor photodetection element SP1 of the fifth embodiment, however, since the irregular asperity 10 is formed in the second principal surface 21b as described above, the travel distance of the light incident into the semiconductor photodetection element SP1 becomes longer. For this reason, it is feasible to realize the semiconductor photodetection element with the sufficient spectral sensitivity characteristic in the near-infrared wavelength band, without need for increasing the thickness of the semiconductor substrate (p-type semiconductor substrate 21), particularly, the portion corresponding to the photosensitive region 29. Therefore, when compared to the semiconductor photodetection element with the spectral sensitivity characteristic in the near-infrared wavelength band based on the increase in the thickness of the semiconductor substrate, the aforementioned semiconductor photodetection element SP1 can achieve good resolution with application of an extremely lower bias voltage or without application of bias voltage. The cooling of the semiconductor substrate also becomes unnecessary, depending upon the intended use.

When the semiconductor substrate, particularly the portion corresponding to the photosensitive region, is thinned, there is a risk of occurrence of an etalon phenomenon. The etalon phenomenon is a phenomenon of interference between detection target light incident from the back surface and light resulting from reflection of the incident detection target light on the front surface, and affects the detection characteristic in the near-infrared wavelength band. In the semiconductor photodetection element SP1, however, since light beams reflected on the asperity 10 have dispersed phase differences relative to the phase of the incident light because of the formation of the irregular asperity 10 in the second principal surface 21b, these light beams cancel each other, so as to suppress the etalon phenomenon.

In the fifth embodiment, the p-type semiconductor substrate 21 is thinned from the second principal surface 21b side. This allows the semiconductor photodetection element to be formed with respective light incident surfaces on the first principal surface 21a and second principal surface 21b sides of the p-type semiconductor substrate 21. Namely, the semiconductor photodetection element SP1 can also be used as a front-illuminated type solid-state imaging device, as well as a back-thinned type solid-state imaging device.

In the case where the irregular asperity 10 is formed by the irradiation with the pulsed laser beam after the formation of the accumulation layer 31, the thickness of the accumulation layer 31 is preferably set larger than the height difference of the irregular asperity 10. In this case, the accumulation layer 31 remains with certainty even after the irregular asperity 10 is formed by the irradiation with the pulsed laser beam. Therefore, it is feasible to ensure the operational effect by the accumulation layer 31.

Figure 27:
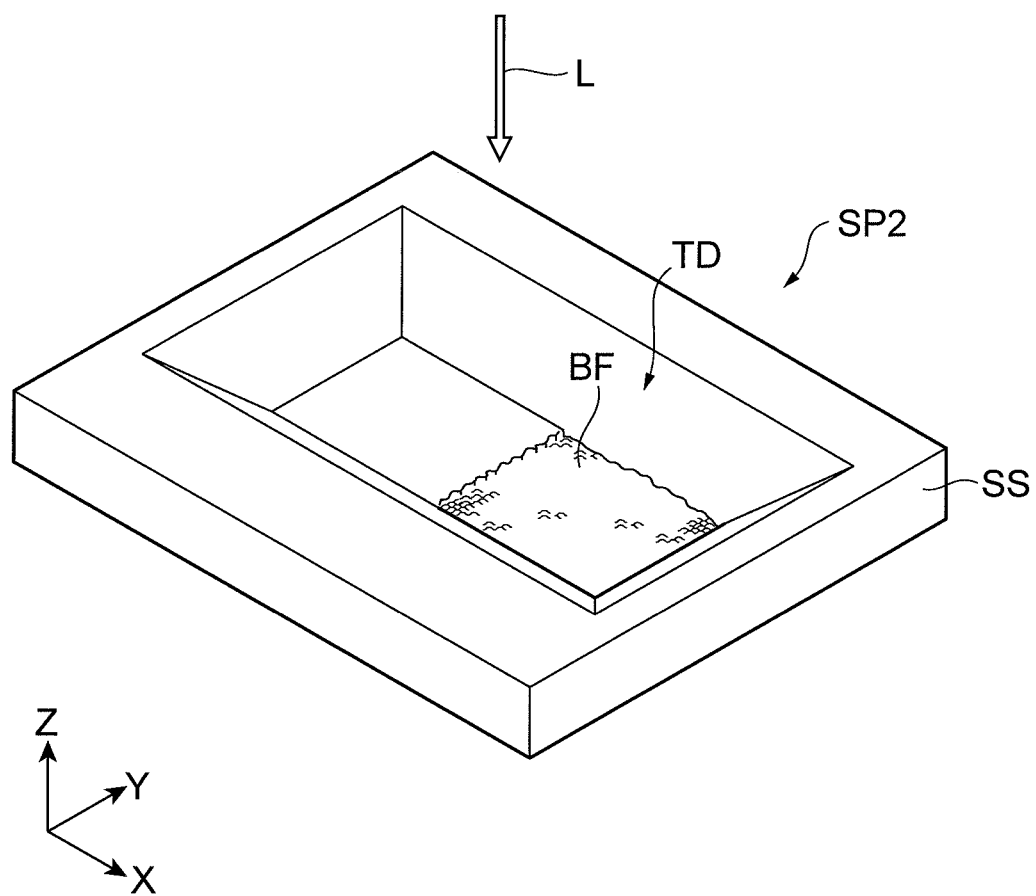
FIG. 27 is a perspective view showing a semiconductor photodetection element according to a modification example of the fifth embodiment.
Figure 28:
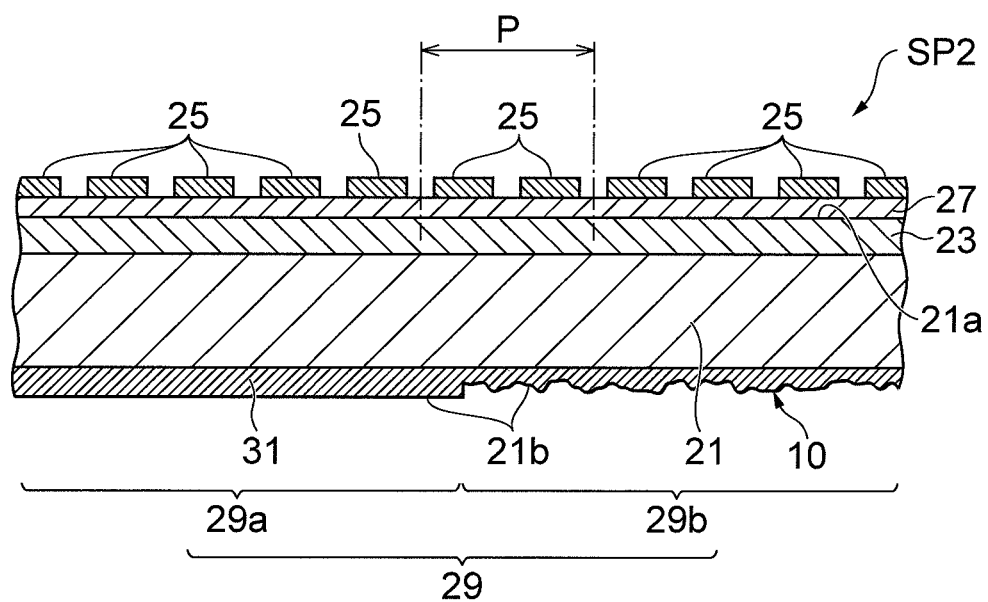
FIG. 28 is a drawing for explaining a cross-sectional configuration of the semiconductor photodetection element according to the modification example of the fifth embodiment.

A semiconductor photodetection element SP2 according to a modification example of the fifth embodiment will be described below with reference to FIGS. 27 and 28. FIG. 27 is a perspective view showing the semiconductor photodetection element according to the modification example of the fifth embodiment. FIG. 28 is a drawing for explaining a cross-sectional configuration of the semiconductor photodetection element according to the modification example of the fifth embodiment.

In the semiconductor photodetection element SP2 of the modification example, a photosensitive region 29 in the second principal surface 21b of the p-type semiconductor substrate 21 includes a first region 29a and a second region 29b, and the irregular asperity 10 is formed in the second region 29b. Namely, the irregular asperity 10 is not formed in the first region 29a of the photosensitive region 29 in the second principal surface 21b of the p-type semiconductor substrate 21.

In the semiconductor photodetection element SP2 of the modification example, the spectral sensitivity characteristic in the near-infrared wavelength band is improved, as described above, in the second region 29b of the photosensitive region 29 in the second principal surface 21b of the p-type semiconductor substrate 21.

Figure 29:
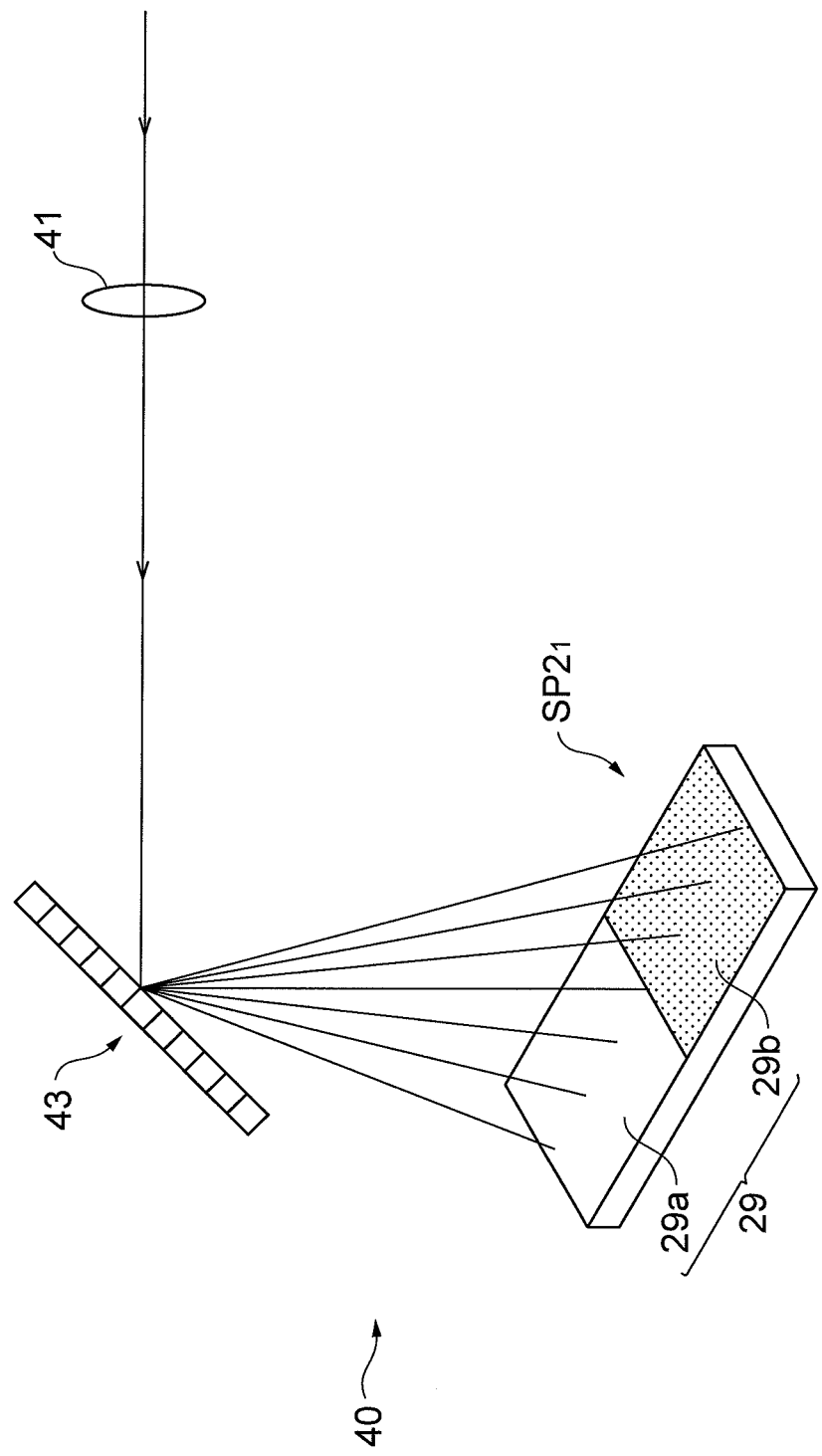
FIG. 29 is a schematic diagram for explaining a configuration of a spectrometer.

A semiconductor photodetection element $SP2_1$ according to a further modification example can be used as a detection element for spectrometer 40, as shown in FIG. 29. The spectrometer 40 is provided with a collimating lens 41, a diffraction grating 43, and the semiconductor photodetection element $SP2_1$. In the spectrometer 40, wavelength components separated by the diffraction grating 43 are incident into the semiconductor photodetection element $SP2_1$. The semiconductor photodetection element $SP2_1$ is arranged so that the second region 29b of the photosensitive region 29 is located on the long wavelength side and the first region 29a on the short wavelength side. The semiconductor photodetection element $SP2_1$ used in the spectrometer 40 is a back-thinned type solid-state imaging device the entire region of which is thinned.

In the case where the semiconductor photodetection element needs to ensure the sensitivity of light in a short wavelength band such as blue as in the above-described example, the irregular asperity 10 is preferably not formed in the region for detecting the light in the short wavelength band such as blue. Since the light in the short wavelength band such as blue is absorbed through a short travel distance, the light is likely to generate carriers in the vicinity of the second principal surface 21b. For this reason, if the irregular asperity 10 is formed in the second principal surface 21b, the generated carriers are trapped in the vicinity of the second principal surface 21b with the irregular asperity 10 therein, raising a risk of hardly contributing to the detection sensitivity.

Therefore, when the semiconductor photodetection element $SP2_1$ is arranged in such a manner that the first region 29a without the irregular asperity 10 is located on the short wavelength side, the detection sensitivity in the near-infrared wavelength band can be improved without reduction in the detection sensitivity of light in the short wavelength band such as blue. Since the light in the near-infrared wavelength band is absorbed through the long travel distance, the light is extremely unlikely to generate carriers near the second principal surface 21b. Therefore, carriers generated with incidence of the light in the near-infrared wavelength band are unlikely to be trapped near the second principal surface 21b with the irregular asperity 10 therein, and thus fully contribute to the detection sensitivity.

When the semiconductor photodetection element $SP2_1$ is a so-called front-illuminated type solid-state imaging device, there is a risk of reduction in the detection sensitivity of light in the short wavelength band such as blue, because of influence of the transfer electrode part and others. Therefore, in order to detect the light in the short wavelength band such as blue, the semiconductor photodetection element $SP2_1$ is preferably a so-called back-thinned type solid-state imaging device.

The above described the preferred embodiments of the present invention, but it should be noted that the present invention is not always limited to the above-described embodiments and that the present invention can be modified in many ways without departing from the spirit and scope of the invention.

In the embodiments the irregular asperity 10 is formed by irradiating the entire area of the second principal surface 1b with the pulsed laser beam, but it is not limited only to this example. For example, the irregular asperity 10 may be formed, for example, by irradiating only a region opposed to the p+ type semiconductor region 3 in the second principal surface 1b of the n− type semiconductor substrate 1 with the pulsed laser beam.

In the embodiments the electrode 15 is in electrical contact with and connection to the n+ type semiconductor region 5 formed on the first principal surface 1a side of the n− type semiconductor substrate 1, but it is not limited only to this example. For example, the electrode 15 may be in electrical contact with and connection to the accumulation layer 11 formed on the second principal surface 1b side of the n− type semiconductor substrate 1. In this case, the electrode 15 is preferably formed outside the region opposed to the p+ type semiconductor region 3 in the second principal surface 1b of the n− type semiconductor substrate 1. The reason for it is as follows: if the electrode 15 is formed in the region opposed to the p+ type semiconductor region 3 in the second principal surface 1b of the n− type semiconductor substrate 1, the irregular asperity 10 formed in the second principal surface 1b is blocked by the electrode 15, causing an event of reduction in the spectral sensitivity in the near-infrared wavelength band.

The conductivity types of p type and n type in the photodiodes PD1-PD4 and the semiconductor photodetection elements SP1, SP1$_1$, SP2, SP2$_1$ in the embodiments may be interchanged so as to be reverse to those described above.

Industrial Applicability

The present invention is applicable to the semiconductor photodetection element and photodetecting device.

List Of Reference Signs 1 n− type semiconductor substrate; 1a first principal surface; 1b second principal surface; 3 p+ type semiconductor region; 5 n+ type semiconductor region; 10 irregular asperity; 11 accumulation layer; 13, 15 electrodes; 21 p-type semiconductor substrate; 21a first principal surface; 21b second principal surface; 23 n-type semiconductor layer; 25 charge transfer electrodes; 27 insulating layer; 31 accumulation layer; PL pulsed laser beam; PD1-PD4 photodiodes; SP1, SP 1$_1$, SP2, SP2$_1$ semiconductor photodetection elements.

The invention claimed is:

1. A semiconductor photodetection element comprising:
a silicon substrate which is comprised of a semiconductor of a first conductivity type, which has a first principal surface and a second principal surface opposed to each other, and which has a semiconductor region of a second conductivity type formed on the first principal surface side; and
a transfer electrode part which is provided on the first principal surface of the silicon substrate and which transfers generated charge,
wherein in the silicon substrate, an accumulation layer of the first conductivity type having a higher impurity concentration than the silicon substrate is formed on the second principal surface side and an irregular asperity is formed in a region opposed to at least the semiconductor region of the second conductivity type, in the second principal surface, and
wherein the region where the irregular asperity is formed in the second principal surface of the silicon substrate is optically exposed.

2. The semiconductor photodetection element according to claim 1, wherein the irregular asperity is formed in a partial region of the region opposed to the semiconductor region of the second conductivity type.

3. The semiconductor photodetection element according to claim 1, wherein the silicon substrate is thinned in a portion corresponding to the semiconductor region of the second conductivity type, from the second principal surface side while leaving a peripheral portion around said portion.

4. The semiconductor photodetection element according to claim 1, wherein a thickness of the accumulation layer of the first conductivity type is larger than a height difference of the irregular asperity.

5. The semiconductor photodetection element according to claim 1, wherein the silicon substrate has a thickness set to not more than a pixel pitch.

6. A photodiode comprising:
a silicon substrate which is comprised of a semiconductor of a first conductivity type, which has a first principal surface and a second principal surface opposed to each other, and which has a semiconductor region of a second conductivity type formed on the first principal surface side,
wherein in the silicon substrate, an accumulation layer of the first conductivity type having a higher impurity concentration than the silicon substrate is formed on the second principal surface side and an irregular asperity is formed in a region opposed to at least the semiconductor region of the second conductivity type, in the second principal surface, and
wherein the region opposed to the semiconductor region of the second conductivity type, in the second principal surface of the silicon substrate is optically exposed.

7. The photodiode according to claim 6, wherein the silicon substrate is thinned in a portion corresponding to the semiconductor region of the second conductivity type, from the second principal surface side while leaving a peripheral portion around said portion.

8. The photodiode according to claim 6, wherein a thickness of the accumulation layer of the first conductivity type is larger than a height difference of the irregular asperity.

* * * * *